US012464949B2

(12) United States Patent
Abe et al.

(10) Patent No.: US 12,464,949 B2
(45) Date of Patent: Nov. 4, 2025

(54) PIEZOELECTRIC ACTUATOR DRIVE METHOD, PIEZOELECTRIC ACTUATOR DRIVE CIRCUIT, AND PIEZOELECTRIC ACTUATOR DRIVE SYSTEM

(71) Applicant: Sony Group Corporation, Tokyo (JP)

(72) Inventors: Hironobu Abe, Tokyo (JP); Masahiro Sato, Tokyo (JP); Hiroya Takenaka, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 842 days.

(21) Appl. No.: 17/776,271

(22) PCT Filed: Oct. 29, 2020

(86) PCT No.: PCT/JP2020/040714
§ 371 (c)(1),
(2) Date: May 12, 2022

(87) PCT Pub. No.: WO2021/100438
PCT Pub. Date: May 27, 2021

(65) Prior Publication Data
US 2022/0393093 A1  Dec. 8, 2022

(30) Foreign Application Priority Data
Nov. 19, 2019  (JP) .................. 2019-208542

(51) Int. Cl.
*H10N 30/80* (2023.01)
*B06B 1/06* (2006.01)
*F04B 43/04* (2006.01)

(52) U.S. Cl.
CPC ......... *H10N 30/802* (2023.02); *B06B 1/0644* (2013.01); *F04B 43/046* (2013.01); *H10N 30/80* (2023.02)

(58) Field of Classification Search
CPC .... H10N 30/802; H10N 30/80; B06B 1/0644; F04B 43/046
See application file for complete search history.

(56) References Cited

U.S. PATENT DOCUMENTS

2004/0135472 A1* 7/2004 Kita ..................... G11B 5/4873
2005/0219288 A1  10/2005 Vogeley et al.
(Continued)

FOREIGN PATENT DOCUMENTS

JP  H06-117377 A   4/1994
JP  2002-362723 A  12/2002
(Continued)

OTHER PUBLICATIONS

International Search Report issued in International Patent Application No. PCT/JP2020/040714 on Jan. 12, 2021 and English translation of same. 7 pages.
(Continued)

*Primary Examiner* — Bryan M Lettman
(74) *Attorney, Agent, or Firm* — K&L Gates LLP

(57) ABSTRACT

The present invention is a piezoelectric actuator drive method, a piezoelectric actuator drive circuit, and a piezoelectric actuator drive system capable of causing a piezoelectric element to vibrate in a maximum amplitude state. The piezoelectric actuator drive circuit includes: an obtainment unit that obtains operation information pertaining to operation of the piezoelectric element in a period that is a part of one cycle of a drive cycle in which the piezoelectric element is driven; and a control unit that performs feedback control of a drive parameter for driving the piezoelectric element based on the operation information.

16 Claims, 14 Drawing Sheets

(56) References Cited

U.S. PATENT DOCUMENTS

2012/0315157 A1    12/2012  Rochat
2021/0043680 A1*  2/2021  Shih .................... H10N 30/802

FOREIGN PATENT DOCUMENTS

| JP | 2007-533902 A | 11/2007 |
| --- | --- | --- |
| JP | 2007-320691 A | 12/2007 |
| JP | 2011-223843 A | 11/2011 |
| JP | 2011223843 | * 11/2011 |
| JP | 2017-131052 A | 7/2017 |
| JP | 2017-183515 A | 10/2017 |
| JP | 2018-079470 A | 5/2018 |

OTHER PUBLICATIONS

Written Opinion issued in International Patent Application No. PCT/JP2020/040714 on Jan. 12, 2021. 5 pages.

* cited by examiner

PIEZOELECTRIC ACTUATOR DRIVE METHOD, PIEZOELECTRIC ACTUATOR DRIVE CIRCUIT, AND PIEZOELECTRIC ACTUATOR DRIVE SYSTEM

TECHNICAL FIELD

The present disclosure relates to a piezoelectric actuator drive method, a piezoelectric actuator drive circuit, and a piezoelectric actuator drive system.

BACKGROUND ART

PTL 1 discloses a piezoelectric element drive circuit that drives a piezoelectric element. This piezoelectric element drive circuit measures a voltage on the output side of the piezoelectric element, obtains a difference between the measured voltage value on the output side of the piezoelectric element that was successfully measured and a target voltage value, and performs feedback control on the voltage supplied to the input side of the piezoelectric element by a waveform generation means to reduce the difference.

CITATION LIST

Patent Literature

[PTL 1]
JP 2018-79470A

SUMMARY

Technical Problem

Conventional piezoelectric element drive circuits have a problem in that it is difficult to perform feedback control to an optimal drive state.

An object of the present disclosure is to provide a piezoelectric actuator drive method, a piezoelectric actuator drive circuit, and a piezoelectric actuator drive system capable of performing feedback control to an optimal drive state.

Solution to Problem

A piezoelectric actuator drive method according to one aspect of the present disclosure includes: obtaining operation information pertaining to operation of a piezoelectric element in a period that is a part of one cycle of a drive cycle in which the piezoelectric element is driven; and performing feedback control of a drive parameter for driving the piezoelectric element based on the operation information.

A piezoelectric actuator drive circuit according to one aspect of the present disclosure includes: an obtainment unit that obtains operation information pertaining to operation of the piezoelectric element in a period that is a part of one cycle of a drive cycle in which the piezoelectric element is driven; and a control unit that performs feedback control of a drive parameter for driving the piezoelectric element based on the operation information.

A piezoelectric actuator drive system according to one aspect of the present disclosure includes: a piezoelectric element; and a piezoelectric actuator drive circuit including an obtainment unit that obtains operation information pertaining to operation of the piezoelectric element in a period that is a part of one cycle of a drive cycle in which the piezoelectric element is driven, and a control unit that performs feedback control of a drive parameter for driving the piezoelectric element based on the operation information.

DESCRIPTION OF EMBODIMENTS

Figure 1:
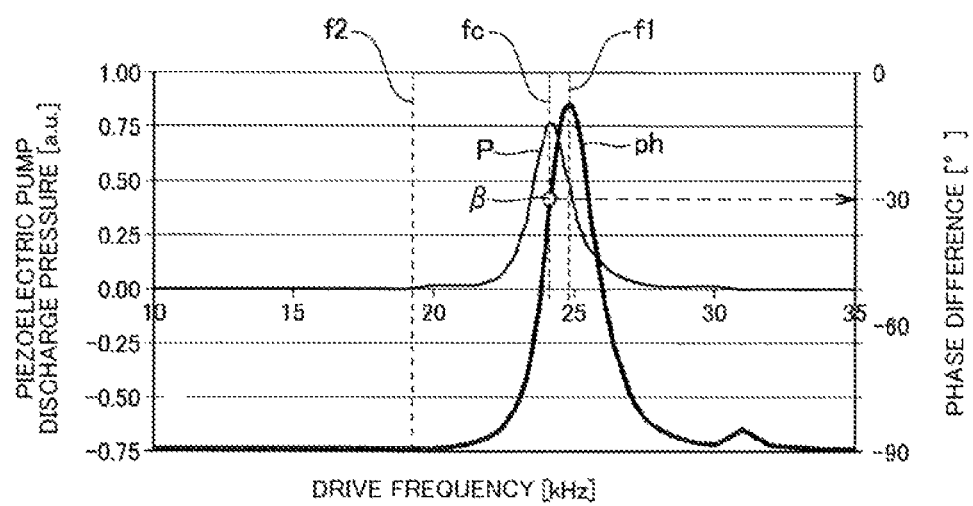
FIG. 1 is a diagram illustrating the basic principle of a piezoelectric actuator drive method according to a first embodiment of the present disclosure (No. 1).

Embodiments for carrying out the present disclosure (embodiments) will be described in detail with reference to the drawings. The following descriptions are one specific example of the present disclosure, and the present disclosure is not limited to the following embodiments.

One cycle of a drive cycle in which a piezoelectric element is driven is a period in which the piezoelectric element performs a series of operations, namely "no displacement (stationary state)→maximum displacement in one direction→stationary state→maximum displacement in the direction opposite from the one direction→stationary state". A piezoelectric actuator is an actuator that uses, as its driving source, a piezoelectric element that repeatedly executes a series of such operations. The greater the maximum value of displacement of the piezoelectric element is, the greater the output of the device in which the piezoelectric actuator is installed becomes. In other words, the greater the value of a maximum amplitude at which the piezoelectric element oscillates is, the greater the output of the device in which the piezoelectric actuator is installed becomes. Therefore, the drive circuit of the piezoelectric actuator according to the present disclosure performs feedback control of drive parameters for driving the piezoelectric element provided in the piezoelectric actuator such that the series of operations is repeated with the maximum value of the displacement of the piezoelectric element at a target value (e.g., a design value). The drive circuit of the piezoelectric actuator performs feedback control of the drive parameters based on the operation information pertaining to the operations of the piezoelectric element, and it is therefore necessary to obtain the operation information for displacing the piezoelectric element at the desired value (e.g., the maximum value).

Therefore, the piezoelectric actuator drive method, the piezoelectric actuator drive circuit, and the piezoelectric actuator drive system according to the present disclosure obtain the operation information pertaining to the operation of the piezoelectric element in a period that is part of one cycle of the drive cycle in which the piezoelectric element is driven, and perform feedback control of the drive parameters for driving the piezoelectric element based on the obtained operation information.

In this manner, a basic principle of the piezoelectric actuator drive method, the piezoelectric actuator drive circuit, and the piezoelectric actuator drive system according to the present disclosure is obtaining the operation information pertaining to the operation of the piezoelectric element in a period that is part of one cycle of the drive cycle in which the piezoelectric element is driven.

First Embodiment

To describe the piezoelectric actuator drive method, the piezoelectric actuator drive circuit, and the piezoelectric actuator drive system according to the first embodiment of the present disclosure, basic principles of the piezoelectric actuator drive method will be described with reference to FIGS. 1 to 7.

FIG. 1 is a graph illustrating the frequency characteristics of the discharge pressure of a piezoelectric pump having a piezoelectric actuator, and the frequency characteristics of a phase difference of drive current flowing to the piezoelectric element with respect to a drive voltage for driving the piezoelectric element provided in the piezoelectric actuator (also referred to as "drive signal phase difference" hereinafter). The drive voltage is the voltage applied to the piezoelectric element in order to cause the piezoelectric element to displace. The drive current is current that flows through the piezoelectric element due to the current that charges a capacitance component of the piezoelectric element and the piezoelectric effect based on the displacement of the piezoelectric element. The horizontal axis of the graph illustrated in FIG. 1 represents the drive frequency of the drive voltage for driving the piezoelectric element provided in the piezoelectric pump, the vertical axis on the left side of the graph represents the discharge pressure of the piezoelectric pump (piezoelectric pump discharge pressure) [a.u.] (any unit), and the vertical axis on the right side of the graph represents the drive signal phase difference [°] of the piezoelectric element. The phase difference is positive when the phase of the drive current is ahead of the phase of the drive voltage, and negative when the phase is behind. The curve "P" shown in FIG. 1 indicates the actual measured value of the frequency characteristics of the piezoelectric pump discharge pressure. The curve "ph" shown in FIG. 1 indicates the actual measured value of the frequency characteristics of the drive signal phase difference.

As illustrated in FIG. 1, the piezoelectric pump discharge pressure has frequency characteristics P that include the frequency at which the output is maximized (also referred to as the "maximum output frequency" hereinafter). In FIG. 1, the maximum output frequency is indicated by "fc" in the frequency characteristics P. The maximum output frequency fc is the frequency at which the piezoelectric element provided in the piezoelectric actuator operates at a maximum amplitude. The piezoelectric pump produces the maximum output when the piezoelectric element is operating at the maximum amplitude. The maximum output frequency fc of the piezoelectric element is, for example, 24 kHz, at which the piezoelectric pump discharge pressure reaches the maximum value. When the drive frequency of the piezoelectric element is the same value as the maximum output frequency fc, the force generated by the piezoelectric element is maximum, and the discharge pressure of the piezoelectric pump is the maximum value. The output of the piezoelectric pump is maximum at the maximum discharge pressure.

As illustrated in FIG. 1, the drive signal phase difference has frequency characteristics ph which are maximum at the low-frequency side and the high-frequency side of the drive frequency and minimum at a first frequency f1 (e.g. 25 kHz) where the drive frequency is higher than the maximum output frequency fc of the piezoelectric element. When the drive frequency exceeds a second frequency f2 (e.g., 20 kHz) that is lower than the maximum output frequency fc of the piezoelectric element, the drive signal phase difference monotonically decreases from a maximum value on the low-frequency side to a minimum value at the first frequency f1. Therefore, the maximum output frequency fc of the piezoelectric element is a frequency between the first frequency f1 and the second frequency f2. When the drive frequency of the piezoelectric element is the first frequency f1, the drive signal phase difference of the piezoelectric element is, for example, −10°. Therefore, in the drive signal of the piezoelectric element, when the drive frequency of the piezoelectric element is the first frequency f1, the phase of the drive current flowing to the piezoelectric element lags behind the phase of the drive voltage for driving the piezoelectric element by 10°, and the absolute value of the phase difference is at a minimum.

In the technical field of devices that use piezoelectric actuators as a driving source, such as piezoelectric pumps, it has been common technical knowledge that the maximum output of a device is obtained by setting the drive signal phase difference of the piezoelectric actuator to a minimum value, i.e., by providing a frequency that maximizes the drive current. However, as a result of intensive study, the authors of the present disclosure have found that the absolute value of the drive signal phase difference of a piezoelectric element provided in a piezoelectric actuator is not minimized at the maximum output frequency fc of the piezoelectric element where the output of the device (the piezoelectric pump, in FIG. 1) is maximized, as illustrated in FIG. 1. In the example illustrated in FIG. 1, the drive signal phase difference of the piezoelectric element provided in the piezoelectric actuator is −10° at the first frequency f1, and is a phase difference ß (e.g., −30°) at the drive frequency where the output of the piezoelectric pump is maximized (the same frequency as the maximum output frequency fc of the piezoelectric element).

A current waveform of the drive current flowing in a capacitive load, when a square AC voltage is applied to the capacitive load as the drive voltage, will be described with reference to FIGS. 2A to 2D and FIGS. 3A to 3D.

Figure 2A:
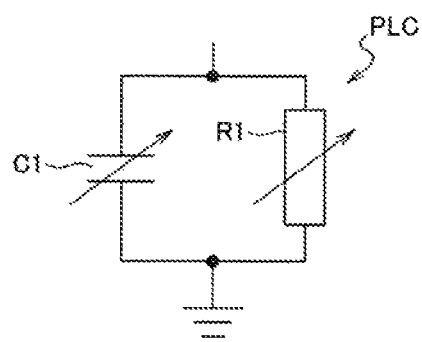
FIG. 2A is a diagram illustrating the basic principle of a piezoelectric actuator drive method according to the first embodiment of the present disclosure (No. 2-1).
Figure 2B:
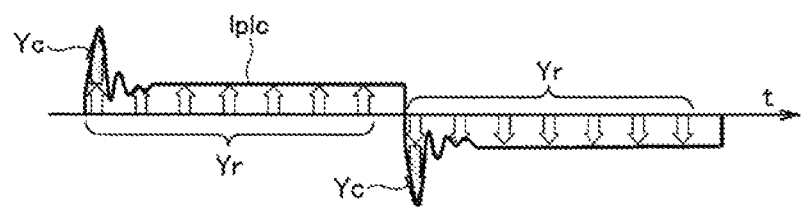
FIG. 2B is a diagram illustrating the basic principle of a piezoelectric actuator drive method according to the first embodiment of the present disclosure (No. 2-2).
Figure 2C:
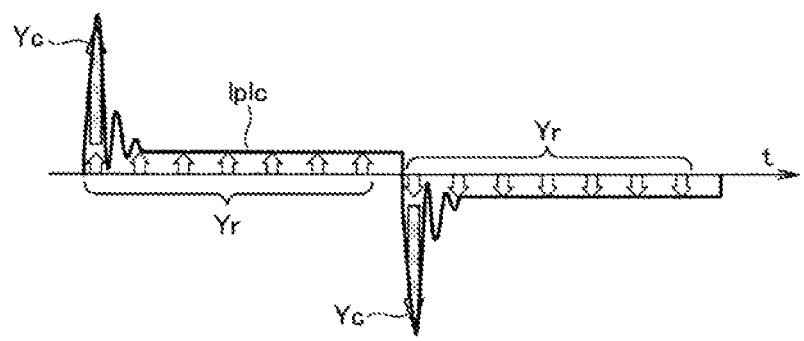
FIG. 2C is a diagram illustrating the basic principle of a piezoelectric actuator drive method according to the first embodiment of the present disclosure (No. 2-3).
Figure 2D:
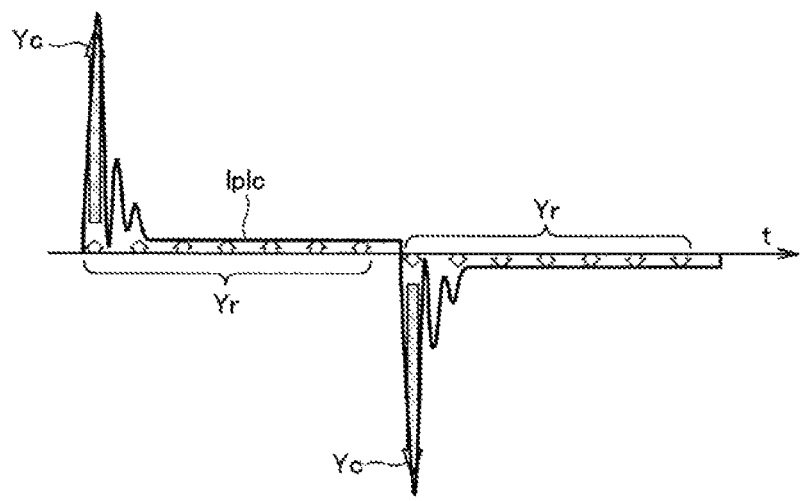
FIG. 2D is a diagram illustrating the basic principle of a piezoelectric actuator drive method according to the first embodiment of the present disclosure (No. 2-4).

FIGS. 2A to 2D are diagrams illustrating a current waveform of drive current Iplc when the load is a parallel circuit PLC constituted by a capacitor C1 and a resistance element R1. FIG. 2A is a diagram illustrating the equivalent circuit of the parallel circuit PLC serving as a load. FIGS. 2B to 2D are diagrams schematically illustrating the current waveform of the drive current when a phase difference between the drive voltage for driving the parallel circuit PLC illustrated in FIG. 2A and the drive current flowing in the parallel circuit PLC is changed. FIG. 2B illustrates the current waveform of the drive current Iplc when the phase difference is minimum, FIG. 2C illustrates the current waveform of the drive current Iplc at a resonance frequency of the parallel circuit PLC (corresponding to the phase difference ß indicated in FIG. 1), and FIG. 2D illustrates the current waveform of the drive current Iplc when the phase difference is about −80°. The phase difference is positive when the phase of the drive current is ahead of the phase of the drive voltage, and negative when the phase of the drive current is ahead of the phase of the drive voltage.

Figure 3A:
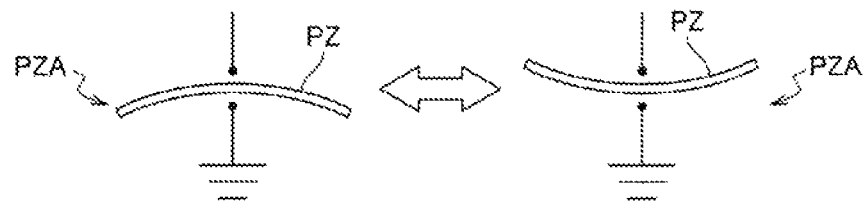
FIG. 3A is a diagram illustrating the basic principle of a piezoelectric actuator drive method according to the first embodiment of the present disclosure (No. 3-1).
Figure 3B:
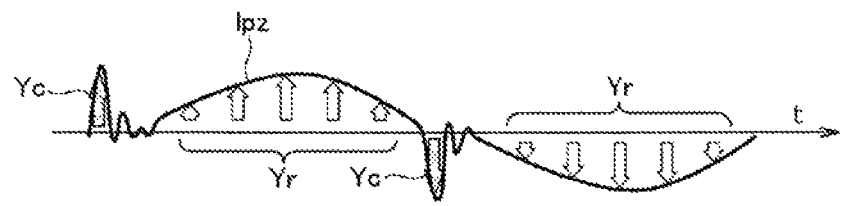
FIG. 3B is a diagram illustrating the basic principle of a piezoelectric actuator drive method according to the first embodiment of the present disclosure (No. 3-2).
Figure 3C:
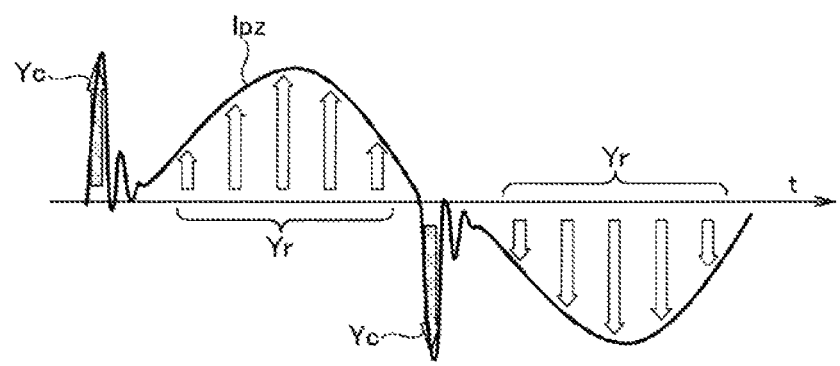
FIG. 3C is a diagram illustrating the basic principle of a piezoelectric actuator drive method according to the first embodiment of the present disclosure (No. 3-3).
Figure 3D:
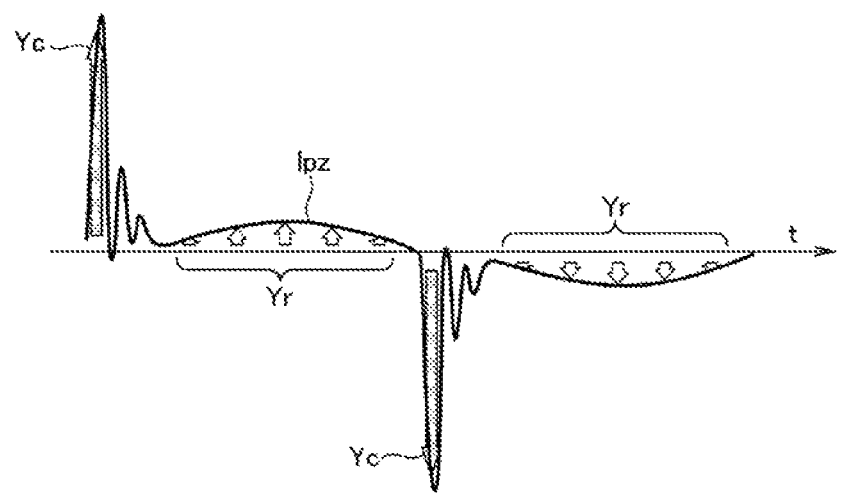
FIG. 3D is a diagram illustrating the basic principle of a piezoelectric actuator drive method according to the first embodiment of the present disclosure (No. 3-4).

FIGS. 3A to 3D are diagrams illustrating a current waveform of a drive current Ipz flowing in a piezoelectric element 21 when a piezoelectric actuator PZA is used as a load. FIG. 3A is a diagram schematically illustrating the operating state of the piezoelectric actuator PZA serving as a load. FIGS. 3B to 3D are diagrams schematically illustrating the current waveform of the drive current Ipz when the phase difference between the drive voltage applied to drive the piezoelectric actuator PZA illustrated in FIG. 3A and the drive current Ipz flowing in a piezoelectric element PZ in the piezoelectric actuator PZA is changed. FIG. 3B illustrates the current waveform of the drive current Ipz when the phase difference is minimized. FIG. 3C illustrates the current waveform of the drive current Ipz at the maximum output frequency of the piezoelectric element PZ provided in the piezoelectric actuator PZA (corresponding to the phase difference ß indicated in FIG. 1). FIG. 3D illustrates the current waveform of the drive current Ipz when the phase difference is about −80°. The phase difference is positive when the phase of the drive current is ahead of the phase of the drive voltage, and negative when the phase of the drive current is ahead of the phase of the drive voltage.

As illustrated in FIG. 2A, the capacitor C1 is an element for which the impedance changes according to the frequency of an applied drive voltage. The resistance element R1 has a capacitance component, and is therefore an element for which the impedance changes according to the frequency of an applied drive voltage, although not as much as the capacitor C1. Therefore, the phase difference between the drive voltage applied to the parallel circuit PLC and the drive current flowing in the parallel circuit PLC also changes according to the frequency.

A resonance circuit is formed by the capacitance component of the parallel circuit PLC and an inductive component of a drive circuit (not shown) that drives the parallel circuit PLC. The resonance circuit is in a resonant state when the phase difference between the drive voltage and the drive current is zero. When the polarity of the drive voltage switches, a charge/discharge current flows through the capacitor C1. The impedance of the parallel circuit PLC is controlled more by the capacitive component of the capacitor C1 as the frequency of the drive voltage moves away from the maximum output frequency fc. Accordingly, with the current waveform of the drive current Iplc flowing in the parallel circuit PLC when the polarity of the drive voltage is switched, as the capacitance component increases, so too does the amount of the charge/discharge current flowing (see the arrow Yc in FIGS. 2B, 2C, and 2D).

During a constant voltage period when the drive voltage is constant, the drive voltage can be regarded as a DC voltage, and thus the inductive component of the drive circuit (not shown) that drives the parallel circuit PLC can be ignored. During the constant voltage period, when the drive voltage is constant, almost no drive current flows through the capacitor C1. Therefore, during the constant voltage period of the drive voltage, most of the drive current flows to the resistance element R1 and becomes almost constant (see the arrow Yr in FIGS. 2B to 2D). When the frequency of the drive voltage is the same as the resonance frequency of the parallel circuit PLC, the impedance of the parallel circuit PLC becomes the lowest, and is almost the same value as the resistance value of the resistance element R. On the other hand, the impedance of the parallel circuit PLC increases with distance from the maximum output frequency fc and as the parallel circuit PLC becomes more capacitive. Therefore, the drive current during the constant voltage period of the drive voltage is the largest when the frequency of the drive voltage is the same as the resonance frequency (see FIG. 2B), and decreases as the frequency of the drive voltage drops (see FIGS. 2C and 2D).

A period from the timing at which the drive voltage of the parallel circuit PLC switches from a negative voltage to a positive voltage (or from a positive voltage to a negative voltage) to the next timing at which the drive voltage switches from a negative voltage to a positive voltage (or from a positive voltage to a negative voltage) is assumed to be one cycle of the drive voltage of the parallel circuit PLC. The amount of the drive current flowing in the parallel circuit PLC corresponding to one cycle of the drive voltage (i.e., an integral value of the current waveform of the drive current Iplc) becomes highest when the current waveform of the drive current Iplc illustrated in FIGS. 2B to 2D is the current waveform of the drive current Iplc illustrated in FIG. 2D, where the phase difference with the drive voltage is the largest.

Incidentally, the piezoelectric element PZ provided in the piezoelectric actuator PZA can be represented by a parallel circuit of a capacitance component and a resistance component. Therefore, as illustrated in FIGS. 3B to 3D, when the piezoelectric actuator PZA is used as a load, the drive current Ipz flowing to the piezoelectric element PZ has a current waveform showing the same trend as the drive current Iplc flowing in the parallel circuit PLC. In other words, a relatively large current flows through the piezoelectric element PZ when the polarity of the drive voltage for driving the element PZ is inverted.

As illustrated in FIG. 3A, the piezoelectric element PZ provided in the piezoelectric actuator PZA continues the mechanical fluctuations initiated by the polarity inversion of the drive voltage, even after the drive voltage becomes constant after the polarity inversion. Therefore, as illustrated in FIGS. 3B to 3D, unlike the resistance element R1, the current value of the piezoelectric element PZ changes due to the piezoelectric effect caused by mechanical fluctuations even when the drive voltage is constant (see the arrow Yr in FIGS. 3B to 3D). Additionally, as illustrated in FIGS. 3B and 3C, the amount of drive current (i.e., the integral value of the current waveform of the drive current) during the constant voltage period of the drive voltage of the piezoelectric element PZ is maximum when the piezoelectric element PZ is driven by a drive voltage having a frequency lower than the frequency at which the phase difference between the drive voltage and the drive current of the piezoelectric element provided in the piezoelectric element PZ is the smallest (see FIG. 3C).

Here, similar to the parallel circuit PLC, a period from the timing at which the drive voltage for driving the piezoelectric element PZ switches from a negative voltage to a positive voltage (or from a positive voltage to a negative voltage) to the next timing at which the drive voltage switches from a negative voltage to a positive voltage (or from a positive voltage to a negative voltage) is assumed to be one cycle of the drive voltage for driving the piezoelectric element PZ (i.e., one cycle of the drive cycle). The amount of the drive current flowing in the piezoelectric element PZ corresponding to one cycle of the drive cycle of the piezoelectric element PZ (i.e., an integral value of the current waveform of the drive current Ipz) becomes highest when the current waveform of the drive current Ipz illustrated in FIGS. 3B to 3D is the current waveform of the drive current Ipz illustrated in FIG. 3D, where the phase difference with the drive voltage is the largest.

Devices provided with piezoelectric actuators use the mechanical fluctuations of the piezoelectric actuators to achieve a predetermined output. Therefore, when the force generated by the piezoelectric element in the piezoelectric actuator is at a maximum, the device in which the piezoelectric actuator is installed will achieve the maximum output. The current waveforms of the drive current Ipz illustrated in FIGS. 3B to 3D can be separated into two periods, namely a period based on the piezoelectric effect caused by the displacement of the piezoelectric element PZ provided in the piezoelectric actuator PZA, and a period based on the polarity inversion of the drive voltage. The period based on the piezoelectric effect caused by the displacement of the piezoelectric element PZ is the constant voltage period of the drive voltage in the drive cycle, and the period based on the polarity inversion of the drive voltage is the remainder of the drive cycle. As can be seen by comparing FIGS. 2B to 2D with FIGS. 3B to 3D, the current waveform of the drive current Ipz flowing in the piezoelectric element PZ and the current waveform of the drive current Iplc flowing in the parallel circuit PLC are different during the constant voltage period of the drive voltage in the drive cycle. In other words, of the drive cycle of the piezoelectric element PZ, the constant voltage period of the drive voltage is the period in which the displacement of the piezoelectric element PZ is reflected, and is a period that contributes to the output of the device in which the piezoelectric actuator is provided. Therefore, it is necessary to obtain the amount of the drive current (i.e., the integral value of the current waveform of the drive current) corresponding to the constant voltage period of the drive voltage in the drive cycle of the piezoelectric element PZ.

The displacement of the mechanical fluctuations in the piezoelectric element PZ is not maximum when the drive signal phase difference of the piezoelectric element PZ is minimum. Therefore, when the drive signal phase difference of the piezoelectric element PZ is minimum, even if the amount of the drive current during the constant voltage period of the drive voltage of the piezoelectric actuator PZA is obtained, a state in which the displacement of the mechanical fluctuations in the piezoelectric element PZ is maximum cannot be detected.

The displacement of the mechanical fluctuations in the piezoelectric element PZ is not maximum when the amount of the drive current flowing in the piezoelectric element PZ, corresponding to one cycle of the drive voltage of the piezoelectric element PZ, is maximum. Therefore, even if the maximum amount of the drive current of the piezoelectric element PZ corresponding to one cycle of the drive voltage of the piezoelectric element PZ is obtained, the state in which the displacement of the mechanical fluctuations in the piezoelectric element PZ is maximum cannot be detected.

Figure 4:
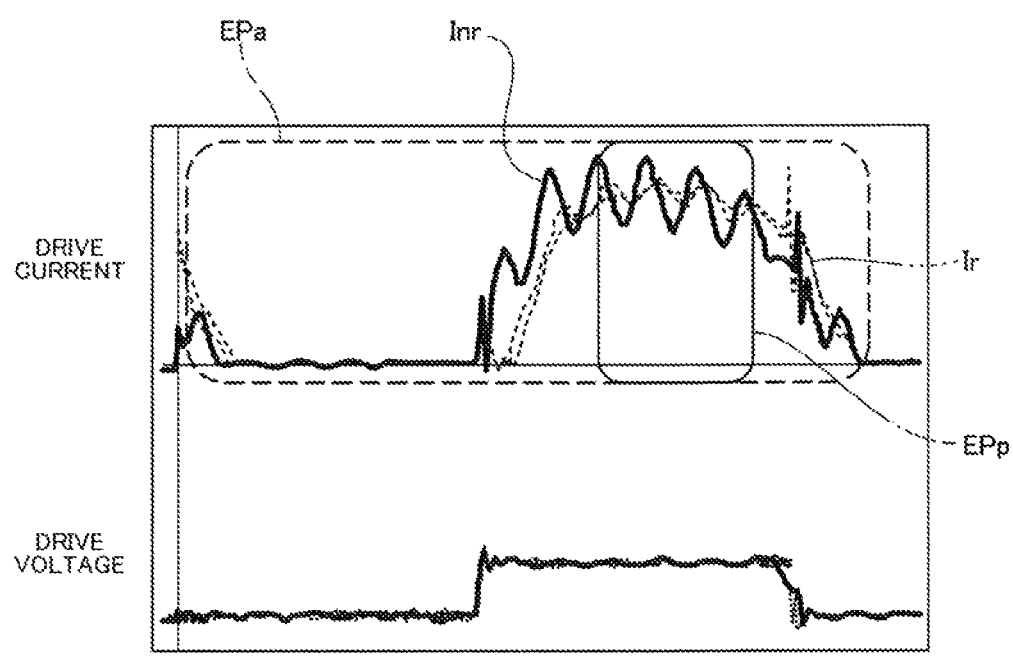
FIG. 4 is a diagram illustrating the basic principle of a piezoelectric actuator drive method according to the first embodiment of the present disclosure (No. 4).

Accordingly, the obtainment range for the drive current of the piezoelectric element in which the state in which the displacement of the mechanical fluctuations in the piezoelectric element is maximum can be detected will be described with reference to FIGS. 4 to 7. FIG. 4 is a diagram illustrating actual measured waveforms of the drive voltage for driving the piezoelectric pump including the piezoelectric actuator and the drive current flowing in the piezoelectric pump. The "drive voltage" in FIG. 4 represents the drive voltage applied to the piezoelectric element provided in the piezoelectric actuator for driving the piezoelectric pump, and the "drive current" in FIG. 4 represents the drive current flowing in the piezoelectric element. The curve "Ir" indicated in FIG. 4 represents the drive current of the piezoelectric element when the piezoelectric pump discharge pressure is at a maximum (i.e., when the piezoelectric element is operating at maximum amplitude). The curve "Inr" indicated in FIG. 4 represents the drive current when the piezoelectric element is vibrating at a frequency lower than the maximum output frequency. The broken line square frame "EPa" indicated in FIG. 4 represents a period for obtaining the drive current, and corresponds to the entirety of one cycle of the drive cycle. The solid line square frame "EPp" indicated in FIG. 4 represents a period for obtaining the drive current, and is a partial section of one cycle of the drive cycle.

Figure 5:
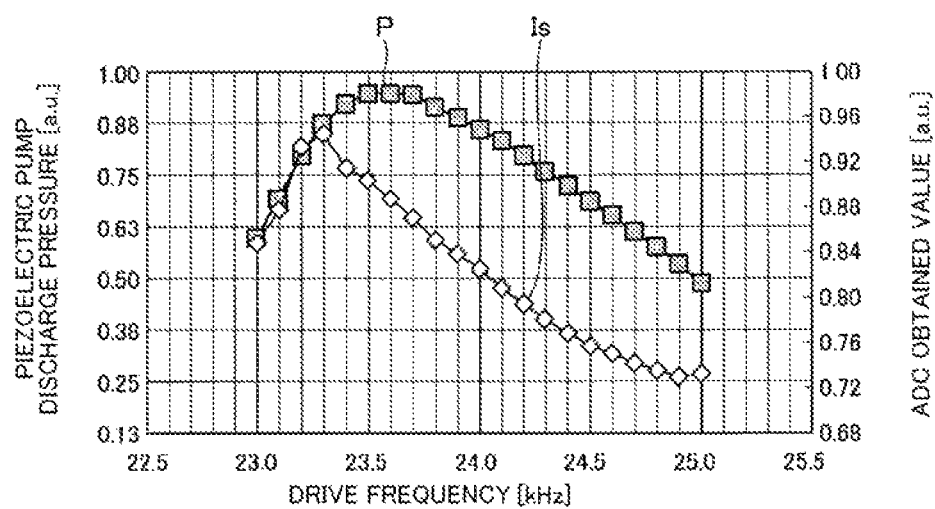
FIG. 5 is a diagram illustrating the basic principle of a piezoelectric actuator drive method according to the first embodiment of the present disclosure (No. 5).
Figure 6:
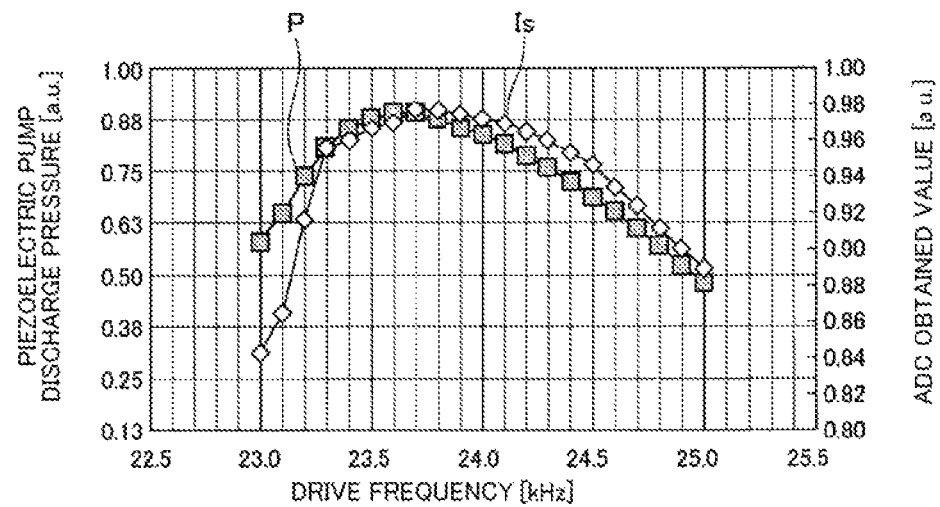
FIG. 6 is a diagram illustrating the basic principle of a piezoelectric actuator drive method according to the first embodiment of the present disclosure (No. 6).

FIGS. 5 and 6 are diagrams illustrating a relationship between the piezoelectric pump discharge pressure and the amount of drive current flowing in the piezoelectric element, relative to the drive frequency of the drive voltage for driving the piezoelectric element provided in the piezoelectric actuator in the piezoelectric pump. FIG. 5 is a diagram illustrating the relationship when the drive current Ir is obtained in the entire section EPa indicated in FIG. 4, and FIG. 6 is a diagram illustrating the relationship when the drive current Ir is obtained in the partial section EPp indicated in FIG. 4. The horizontal axis of the graphs in FIGS. 5 and 6 represents the drive frequency. The vertical axis on the left side of the graphs in FIGS. 5 and 6 represents the piezoelectric pump discharge pressure [a.u.] (any unit). The vertical axis on the right side of the graphs in FIGS. 5 and 6 represents the ADC obtainment value of the drive current [a.u.] (any unit). The ADC obtainment value is a digital value that indicates the amount of the current obtained by analog-to-digital conversion (ADC) of the amount of the drive current. The curve "P" connecting the ■ marks indicated in FIGS. 5 and 6 represents the frequency characteristics of the piezoelectric pump discharge pressure. The curve "Is" connecting the ◇ marks indicated in FIGS. 5 and 6 represents the frequency characteristics of the drive current.

As illustrated in FIG. 4, in one cycle of the drive voltage, the drive current Ir flowing to the piezoelectric element when the piezoelectric pump discharge pressure is maximum is lower than the drive current Inr flowing when the piezoelectric element provided in the piezoelectric actuator is vibrating at a frequency lower than the maximum output frequency. However, as described with reference to FIG. 3, when the piezoelectric element is vibrating at a frequency lower than the maximum output frequency, the drive current flowing in the piezoelectric element is current resulting from the capacitive component. Therefore, even if the amount of the drive current flowing in the piezoelectric element in one cycle of the drive voltage is large, the vibration of the piezoelectric element contributes almost nothing to the operation of the piezoelectric pump. Therefore, in the present embodiment, although the amount of the drive current flowing in the piezoelectric element in one cycle of the drive voltage is reduced, the drive current Ir, in which the vibration of the piezoelectric element contributes to the operation of the piezoelectric pump, is used to obtain the operation information.

As illustrated in FIG. 5, when the drive current Ir is obtained for the entire section EPa, which corresponds to one cycle of the drive cycle of the piezoelectric element provided in the piezoelectric actuator, the frequency characteristics P of the piezoelectric pump discharge pressure and the frequency characteristics Is of the drive current Ir are substantially the same as those when the drive frequency is 23.0 kHz to 23.3 kHz. However, the frequency characteristics P of the piezoelectric pump discharge pressure and the frequency characteristics Is of the drive current Ir are different when the drive frequency is higher than 23.3 kHz. Specifically, the frequency characteristics P of the piezoelectric pump discharge pressure have a characteristic of increasing as the drive frequency increases from 23.5 kHz to about 23.6 kHz, and then monotonically decreasing as the drive frequency becomes higher than 23.6 kHz. In contrast, the frequency characteristics Is of the drive current Ir have a characteristic of monotonically decreasing as the drive frequency becomes higher than 23.5 kHz. In this manner, the frequency at which the drive current Ir is maximized and the frequency at which the piezoelectric pump discharge pressure is maximized are different, and the frequency at which the piezoelectric pump discharge pressure is maximized cannot be obtained from the frequency characteristics Is of the drive current Ir.

On the other hand, as illustrated in FIG. 6, when the drive current Ir is obtained for the partial section EPp, which corresponds to part of one cycle of the drive cycle of the piezoelectric element provided in the piezoelectric actuator, the frequency characteristics P of the piezoelectric pump discharge pressure and the frequency characteristics Is of the drive current Ir are substantially the same when the drive frequency is higher than 23.3 kHz. In particular, the frequency characteristics P of the piezoelectric pump discharge pressure and the frequency characteristics Is of the drive current Ir have almost the same frequency characteristics at around 23.8 kHz, which is where the piezoelectric pump discharge pressure is at a maximum.

Therefore, in order to obtain the maximum output of the device in which the piezoelectric actuator is provided (the piezoelectric pump, in FIGS. 4 to 6), it is sufficient to obtain the amount of the drive current (i.e., the integral value of the drive current) for the partial section corresponding to a part of one cycle of the drive cycle when the frequency at which the force generated by the piezoelectric element provided in the piezoelectric actuator is maximum can be obtained.

Figure 7:
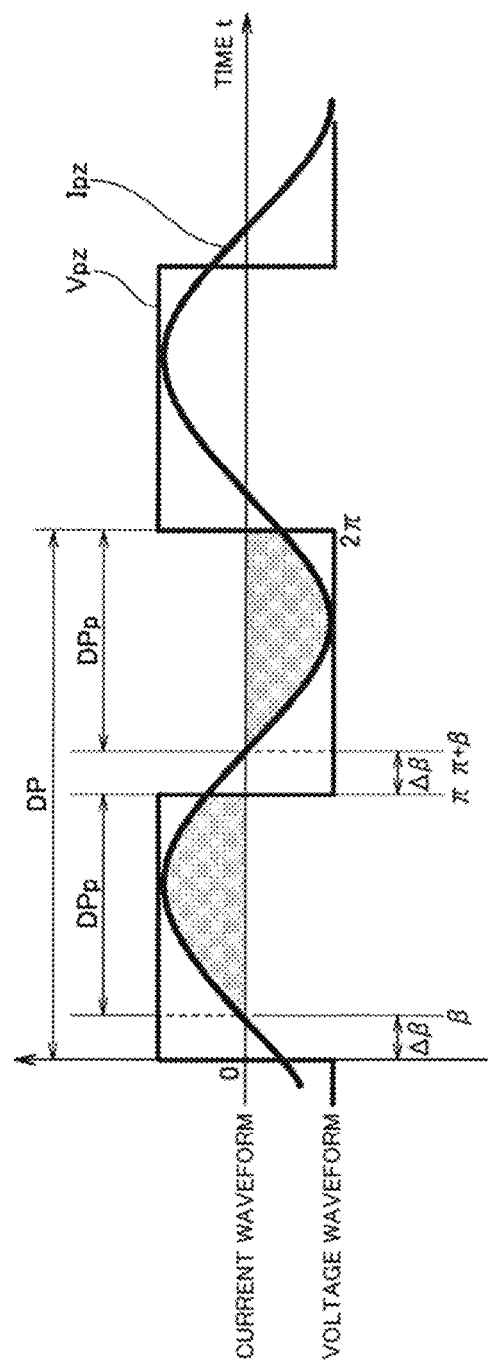
FIG. 7 is a diagram illustrating the basic principle of a piezoelectric actuator drive method according to the first embodiment of the present disclosure (No. 7).

FIG. 7 is a diagram illustrating a range for obtaining the operation information for feedback control of the drive parameters of the piezoelectric element provided in the piezoelectric actuator, and schematically illustrates an example of the voltage waveform of the drive voltage for driving the piezoelectric element and the current waveform of the drive current flowing in the piezoelectric element.

As described with reference to FIG. 1, in a piezoelectric actuator where the piezoelectric element is a driving actuator, the drive signal phase difference is not at a minimum value when the amplitude of the piezoelectric element is at a maximum. In the piezoelectric actuator, the amplitude of the piezoelectric element is at a maximum when the phase of the drive current is delayed by a predetermined value relative to the phase of the drive voltage. In the present embodiment, the drive current having a phase delayed relative to the phase of the drive voltage for driving the piezoelectric element is used to obtain the operation information for feedback control of the drive parameters of the piezoelectric element from the drive current flowing in the piezoelectric element in a state where the amplitude is maximum. The relationship between the maximum output frequency of the piezoelectric element (i.e., the frequency at which the piezoelectric element operates at maximum amplitude) and the phase of the drive current flowing in the piezoelectric element may be obtained by actually measuring the piezoelectric actuator provided with the piezoelectric element operating in a predetermined environment, or may be obtained by simulations.

In the present embodiment, the period from the time at which the force generated by the piezoelectric element is maximum to the time at which the drive cycle in which the piezoelectric element is driven is a half cycle is the longest period that can be set as a part of one cycle of the drive cycle. Here, the piezoelectric element operating at maximum amplitude it corresponds to the maximum force generated by the piezoelectric element. Assume that a drive voltage Vpz for driving the piezoelectric element is an AC voltage having a rectangular voltage waveform, and the drive current Ipz flowing in the piezoelectric element is sinusoidal, corresponding to the mechanical vibrations of the piezoelectric element. In addition, assume that the phase of the drive current Ipz is behind the phase of the drive voltage Vpz by ß at the time when the force generated by the piezoelectric element is maximum.

If the point in time at which the polarity of the drive voltage Vpz inverts is used as a reference for the phase, the drive current Ipz for obtaining the operation information will have a current waveform in which the current value becomes zero at the point in time after the phase ß from the point in time of the polarity inversion of the drive voltage Vpz, as illustrated in FIG. 7. The drive current that flows in the piezoelectric element when the polarity of the drive voltage Vpz inverts is a current that produces almost no vibration in the piezoelectric element (the current waveform of the current component of this current is not shown). Accordingly, the longest period that can be set as the operation information obtainment period (an example of a period that is part of one cycle of the drive cycle in which the piezoelectric element is driven) AP for obtaining the operation information pertaining to the operation of the piezoelectric element is from phase ß to phase π or from phase ß+π to phase 2π.

As described with reference to FIG. 6, the frequency characteristics of the amount of the drive current (i.e., the integral value of the current waveform of the drive current) in a period that is part of one cycle of the drive voltage for driving the piezoelectric element in the piezoelectric actuator (i.e., the drive cycle of the piezoelectric element) substantially matches the frequency characteristics of the discharge pressure of the piezoelectric pump in a frequency band where the discharge pressure of the piezoelectric pump in which the piezoelectric actuator is provided is maximum. When the piezoelectric element operates at the maximum amplitude, the phase of the drive current flowing in the piezoelectric element is behind the phase of the drive voltage by ß, and the phase difference between the drive voltage and the drive current is Δß. In this case, in the present embodiment, the amount of current in a period that is part of one cycle of the drive current having a phase difference Δß, which is a phase delayed with respect to the drive voltage, is obtained as the operation information of the piezoelectric element. Performing feedback control of the drive parameters based on the obtained operation information makes it possible for the device in which the piezoelectric actuator is used to operate at maximum output.

As indicated in FIG. 7, in the present embodiment, the operation information obtainment period AP, which corresponds to a period of a part of one cycle DP of the drive cycle of the piezoelectric element provided in the piezoelectric actuator, can be set to a period from phase ß to phase π or from phase π+ß to phase 2π, of the cycle DP of the drive voltage for driving the piezoelectric element, as the longest period. If the operation information obtainment period AP is set in the period from phase π+ß to phase 2π, it is necessary to invert the positive and negative values of the obtained operation information, which complicates the circuit configuration of an operation information obtainment unit (described in detail later) that is provided in the drive circuit of the piezoelectric actuator and that obtains the operation information. Therefore, in the present embodiment, the operation information obtainment period AP is set in the period from phase ß to phase π. Although there is no limit to the length of the operation information obtainment period AP that is set as long as the period is between phase ß and phase π or between phase π+ß and phase 2π, the accuracy of the operation information will be improved if the period is set to be as long as possible.

(Piezoelectric Actuator Drive Circuit and Piezoelectric Actuator Drive System)

Figure 8:
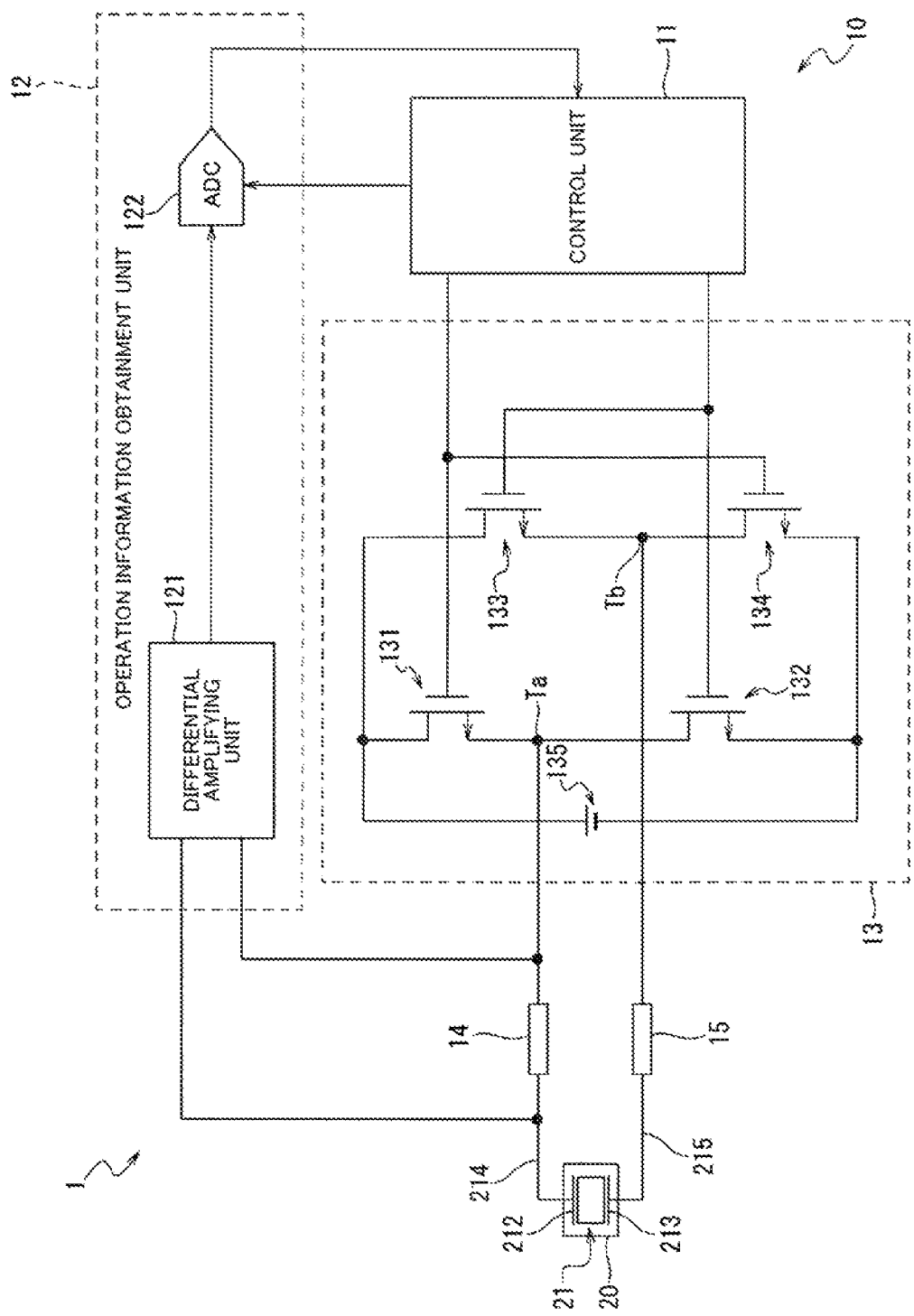
FIG. 8 is a block diagram illustrating an example of the overall configuration of a piezoelectric actuator drive circuit and a piezoelectric actuator drive system according to the first embodiment of the present disclosure.
Figure 9A:
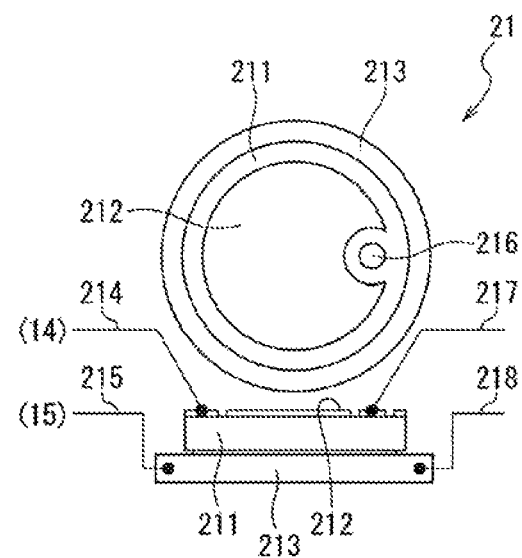
FIG. 9A is a diagram illustrating the overall configuration of a piezoelectric element in the piezoelectric actuator drive circuit and the piezoelectric actuator drive system according to the first embodiment of the present disclosure.
Figure 9B:
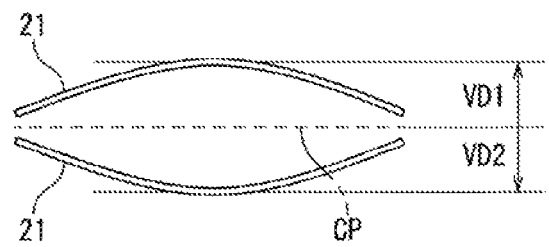
FIG. 9B is a schematic diagram illustrating displacement of the piezoelectric element in the piezoelectric actuator drive circuit and the piezoelectric actuator drive system according to the first embodiment of the present disclosure.
Figure 10:
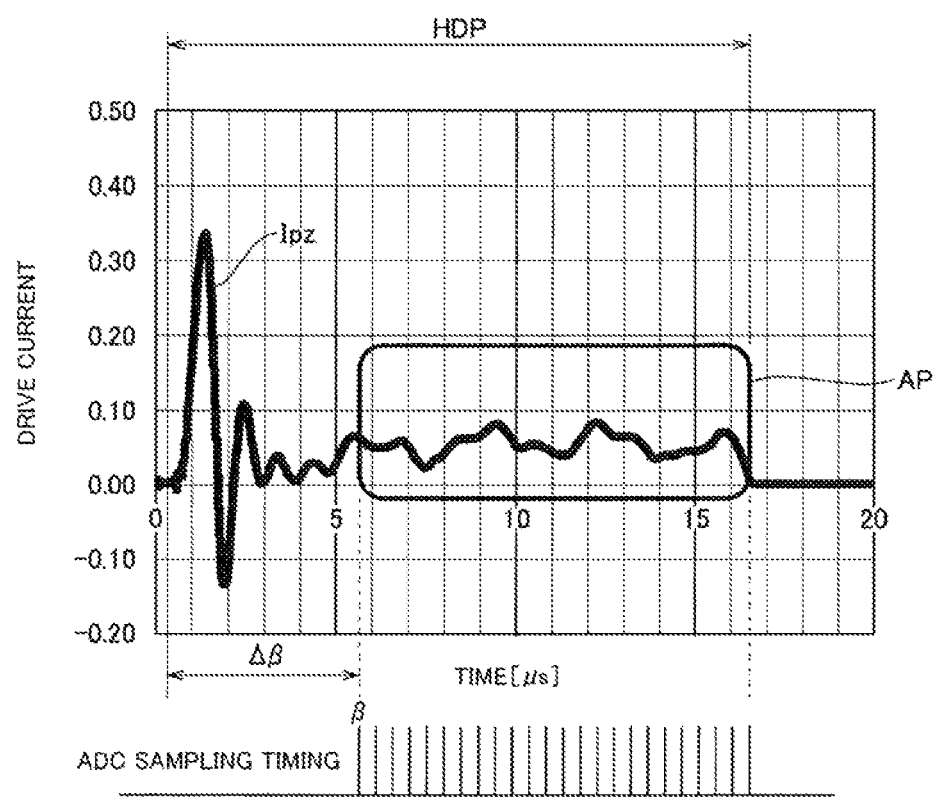
FIG. 10 illustrates an operation information obtainment period in an actuator drive method, a piezoelectric actuator drive circuit, and the piezoelectric actuator drive system according to the first embodiment of the present disclosure.

Next, the piezoelectric actuator drive circuit and the piezoelectric actuator drive system according to the present embodiment will be described with reference to FIGS. 8 to 14. FIG. 8 is a circuit diagram illustrating the overall configuration of a piezoelectric actuator drive circuit 10 and a piezoelectric actuator drive system 1. FIG. 9A is a diagram illustrating the overall configuration of the piezoelectric element 21 provided in the piezoelectric actuator drive system 1. The top part of FIG. 9A illustrates the piezoelectric element 21 viewed in the application direction of the drive voltage, and the bottom part of FIG. 9A illustrates the piezoelectric element 21 viewed in a direction orthogonal to the application direction of the drive voltage. FIG. 9B is a diagram schematically illustrating a displacement state of the piezoelectric element 21. FIG. 10 is a diagram illustrating operations of an operation information obtainment unit 12 provided in the piezoelectric actuator drive circuit 10. The top part of FIG. 10 illustrates the current waveform of the drive current, and the bottom part of FIG. 10 schematically illustrates a sampling timing in an analog-digital conversion unit 122 provided in the operation information obtainment unit 12.

As illustrated in FIG. 8, the piezoelectric actuator drive system 1 includes the piezoelectric element 21 and the piezoelectric actuator drive circuit 10. The piezoelectric actuator drive system 1 includes a piezoelectric actuator 20 having the piezoelectric element 21. The piezoelectric actuator drive system 1 is configured to drive a device (not shown; a piezoelectric pump or the like, for example) using the mechanical displacement action of the piezoelectric actuator 20 as a driving source.

The piezoelectric actuator drive circuit 10 includes the an operation information obtainment unit (an example of an obtainment unit) 12 that obtains operation information pertaining to the operation of the piezoelectric element 21 during a period that is part of a drive cycle in which the piezoelectric element 21 is driven. The piezoelectric actuator drive circuit 10 also includes a control unit 11 that performs feedback control of the drive parameters for driving the piezoelectric element 21 based on the operation information. The piezoelectric actuator drive circuit 10 includes an H-bridge circuit 13 that generates the drive voltage applied to the piezoelectric element 21, a resistance element 14 provided between an input/output terminal Ta of the H-bridge circuit 13 and a first electrode 212 of the piezoelectric element 21, and a resistance element 15 provided between an input/output terminal Tb of the H-bridge circuit 13 and a second electrode 213 of the piezoelectric element 21. One terminal of the resistance element 14 is connected to the first electrode 212 of the piezoelectric element 21, and the other terminal of the resistance element 14 is connected to the input/output terminal Ta of the H-bridge circuit 13. One terminal of the resistance element 15 is connected to the second electrode 213 of the piezoelectric element 21, and the other terminal of the resistance element 15 is connected to the input/output terminal Tb of the H-bridge circuit 13.

The operation information obtainment unit 12 includes a differential amplifying unit 121 to which a voltage across both ends of the resistance element 14 is input, and an analog-to-digital converter (ADC) unit 122 that converts an analog output signal output from the differential amplifying unit 121 into a digital output signal. The analog-to-digital converter unit may be abbreviated as "ADC" in the following.

The control unit 11 is constituted by, for example, a Micro Controller Unit (MCU) or a Field Programmable Gate Array (FPGA). The control unit 11 stores the phase ß of the drive current for obtaining the operation information in a predetermined storage region. The control unit 11 also stores, in the predetermined storage region, a target current value of the drive current at which the output of the device in which the piezoelectric actuator 20 is provided is maximum. The phase ß and the target current value of the drive current stored in the stated storage region may be obtained from actual measurements taken when the device which the piezoelectric actuator 20 is provided (the discharge pressure, in the case of a piezoelectric pump) operates in a predetermined environment, or may be obtained from simulations.

The control unit 11 is configured to output a timing control signal for controlling the timing of obtaining the drive current flowing in the piezoelectric element 21 to the operation information obtainment unit 12, and control the stated timing. The control unit 11 is configured to generate a drive pulse signal for controlling the H-bridge circuit 13 based on a comparison result between the current value of the drive current of the piezoelectric element 21 input from the operation information obtainment unit 12 and the target current value of the drive current stored in the storage region. Furthermore, the control unit 11 is configured to output the generated drive pulse signal to the H-bridge circuit 13.

As illustrated in FIG. 8, the H-bridge circuit 13 includes a transistor 131 and a transistor 132 connected in series, and a transistor 133 and a transistor 134 connected in series. The transistors 131, 132, 133, and 134 are constituted by N-type field effect transistors, for example. The transistor 131 and the transistor 132 are connected in parallel with the transistor 133 and the transistor 134. The H-bridge circuit 13 has a DC power supply 135 connected in parallel with the transistor 131 and the transistor 132, and with the transistor 133 and the transistor 134.

A positive terminal of the DC power supply 135 is connected to the drain of the transistor 131 and the drain of the transistor 133. A negative terminal of the DC power supply 135 is connected to the source of the transistor 132 and the source of the transistor 134. The source of the transistor 131 is connected to the drain of the transistor 132, and the source of the transistor 133 is connected to the drain of the transistor 134.

The gate of the transistor 131 and the gate of the transistor 134 are connected to one output terminal of the control unit 11. The gate of the transistor 132 and the gate of the transistor 133 are connected to another output terminal of the control unit 11. As a result, the transistor 131 and the transistor 134 are in an on state (a conductive state) when the signal level of the drive pulse signal input from the control unit 11 is high level, and an off state (a non-conductive state) when the signal level of the drive pulse signal is low level. Additionally, the transistor 132 and the transistor 133 are in an on state (a conductive state) when the signal level of the drive pulse signal input from the control unit 11 is high level, and an off state (a non-conductive state) when the signal level of the drive pulse signal is low level.

A connection part between the source of the transistor 131 and the drain of the transistor 132 serves as the input/output terminal Ta of the H-bridge circuit 13. A connection part between the source of the transistor 133 and the drain of the transistor 134 serves as the input/output terminal Tb of the H-bridge circuit 13.

The control unit 11 is configured to output drive pulse signals having inverted signal levels from one output terminal and the other output terminal. Accordingly, when the transistor 131 and the transistor 134 are in the on state, the transistor 132 and the transistor 133 are in the off state, and when the transistor 131 and the transistor 134 are in the off state, the transistor 132 and the transistor 133 are in the on state. As a result, the H-bridge circuit 13 outputs a voltage value that is the same as the output voltage of the DC power supply 135, with the input/output terminal Ta being positive and the input/output terminal Tb being negative, when the transistor 131 and the transistor 134 are in the on state. As a result, the H-bridge circuit 13 can output a drive current that flows in the direction of "input/output terminal Ta→resistance element 14→piezoelectric element 21→resistance element 15→input/output terminal Tb". Additionally, the H-bridge circuit 13 outputs a voltage value that is the same as the output voltage of the DC power supply 135, with the input/output terminal Tb being positive and the input/output terminal Ta being negative, when the transistor 132 and the transistor 133 are in the on state. As a result, the H-bridge circuit 13 can output a drive current that flows in the direction of "input/output terminal Tb→resistance element 15→piezoelectric element 21→resistance element 14→input/output terminal Ta".

As illustrated in FIG. 9A, the piezoelectric element 21 includes a piezoelectric body 211 formed of, for example, lead zirconate titanate (PZT), as well as the first electrode 212 and the second electrode 213 disposed with the piezoelectric body 211 interposed therebetween. The piezoelectric body 211 has a thin disk shape, for example. The first electrode 212 is provided in contact with one plane of the piezoelectric body 211, and the second electrode 213 is provided in contact with the back side of the plane. The first electrode 212 is formed as a thin, circular metal plate. The second electrode 213 has a thin disk shape that is approximately the same thickness as the piezoelectric body 211 but slightly larger. The second electrode 213, for example, is formed from the same material metal as the first electrode 212. The first electrode 212 is connected to the resistance element 14 (not shown in FIG. 9A; see FIG. 8) by a wire 214 connected to a part of the outer circumferential part of the first electrode 212. The second electrode 213 is connected to the resistance element 15 (not shown in FIG. 9A; see FIG. 8) by a wire 215 connected to a part of a side wall of the second electrode 213. As a result, the drive voltage output from the H-bridge circuit 13 (not shown in FIG. 9A; see FIG. 8) is applied in a thickness direction of the piezoelectric body 211.

As illustrated in FIG. 9A, the piezoelectric element 21 may include an electrode terminal 216 in the plane where the first electrode 212 is provided. The electrode terminal 216 is used to detect the voltage produced by the displacement of the piezoelectric element 21. A wire 217 is connected to the electrode terminal 216, and a wire 218 that forms a pair with the wire 217 is connected to another part of the side wall of the second electrode 213. The electrode terminal 216 and the second electrode 213 are connected to the operation information obtainment unit 12 by the wires 217 and 218. This enables the piezoelectric element 21 to output the voltage produced by the displacement to the operation information obtainment unit 12.

When using the electrode terminal 216, the operation information obtainment unit 12 may obtain a vibration voltage generated by the vibration or displacement of the piezoelectric element 21 as the operation information. In the case of using the electrode terminal 216, the operation information obtainment unit 12 may obtain the drive current flowing in the piezoelectric element 21 and the vibration voltage generated by the vibration of the piezoelectric element 21 as the operation information at the same time or switching between the two.

As illustrated in FIG. 9B, the piezoelectric element 21 is displaced from a center position CP in the voltage application direction according to the application direction of the drive voltage. For example, if the drive voltage is applied so that the first electrode 212 has a higher voltage than the second electrode 213, the piezoelectric element 21 will be displaced in the direction of vibration displacement VD1, for example. If the drive voltage is applied so that the first electrode 212 has a lower voltage than the second electrode 213, the piezoelectric element 21 will be displaced in the direction of vibration displacement VD2, for example. In the present embodiment, the piezoelectric actuator drive circuit 10 is configured to apply, to the piezoelectric element 21, a drive voltage at which the vibration displacements VD1 and VD2 of the piezoelectric element 21 are maximum, by performing feedback control of the drive parameters. However, the piezoelectric actuator drive circuit 10 may be configured to apply, to the piezoelectric element 21, a drive voltage that causes the piezoelectric element 21 to displace to the vibration displacement VD1 or the vibration displacement VD2 and at which the displacement is maximum, by performing feedback control of the drive parameters.

Returning to FIG. 8, the differential amplifying unit 121 provided in the operation information obtainment unit 12 is configured to input the voltage across both ends of the resistance element 14. One input terminal of the differential amplifying unit 121 is connected between the resistance element 14 and the H-bridge circuit 13. The other input terminal of the differential amplifying unit 121 is connected between the resistance element 14 and the piezoelectric element 21. More specifically, one input terminal of the differential amplifying unit 121 is connected to one terminal of the resistance element 14 and the first electrode 212 of the piezoelectric element 21. The other input terminal of the differential amplifying unit 121 is connected to the other terminal of the resistance element 14 and the input/output terminal Ta of the H-bridge circuit 13.

The differential amplifying unit 121 is configured to amplify the voltage input to one input terminal by subtracting the voltage input to the other input terminal, and output the amplified voltage to the ADC 122. The differential amplifying unit 121 is constituted by a single-supply amplifier, for example, and does not output a negative voltage. Therefore, if the voltage input to one input terminal is higher than the voltage input to the other input terminal, the differential amplifying unit 121 outputs a zero-volt voltage regardless of the voltage value. As such, the differential amplifying unit 121 can detect the voltage drop that occurs between both terminals of the resistance element 14 due to the flow of current from the piezoelectric element 21 toward the H-bridge circuit 13. On the other hand, the differential amplifying unit 121 does not detect the voltage drop that occurs between both terminals of the resistance element 14 due to the flow of current from the H-bridge circuit 13 toward the piezoelectric element 21. In this manner, the operation information obtainment unit 12 obtains the drive current flowing in the piezoelectric element 21 as the operation information according to the voltage drop of the resistance element 14. The differential amplifying unit 121 achieves its purpose to a sufficient degree simply by detecting the drive current in one direction flowing between the H-bridge circuit 13 and the piezoelectric element 21. For this reason, the differential amplifying unit 121 is constituted by a single-supply amplifier to simplify the circuit configuration.

As illustrated in FIG. 8, the input terminal of the ADC 122 is connected to the output terminal of the differential amplifying unit 121. This makes it possible for the voltage output by the differential amplifying unit 121 to be input to the ADC 122. The ADC 122 is configured to convert the voltage of the analog signal input from the differential amplifying unit 121 into a digital signal based on a sampling control signal input from the control unit 11, and output the resulting signal to the control unit 11.

The piezoelectric actuator drive circuit 10 obtains the operation information during a part of the drive cycle for driving the piezoelectric element 21. As described above, the piezoelectric actuator drive circuit 10 is configured such that the control unit 11 controls the obtainment of the operation information. Therefore, the control unit 11 stores the operation information obtainment period AP as a period that is part of the drive cycle for driving the piezoelectric element 21, and the phase ß of the drive current of the piezoelectric element 21. The control unit 11 outputs, to the ADC 122, a sampling control signal, from a point in time delayed by a phase ß relative to the point in time when the drive pulse signal is output to the H-bridge circuit 13 to put the transistors 132 and 133 in the H-bridge circuit 13 in the on state and put the transistors 131 and 134 in the off state, until the point in time when the operation information obtainment period AP ends.

As illustrated in FIG. 10, the ADC 122 samples the voltage of the analog signal input from the differential amplifying unit 121 and converts the analog signal to a digital signal at the timing when the sampling control signal is input from the control unit 11. To facilitate understanding, the current waveform of the drive current Ipz is illustrated in FIG. 10. The voltage of the analog signal input from the differential amplifying unit 121 is based on the difference between the voltages produced at both terminals of the resistance element 14 by the drive current Ipz flowing in the piezoelectric element 21 flowing through the resistance element 14. As such, the voltage of the analog signal that the ADC 122 converts into a digital signal is proportional to the drive current Ipz, and thus the voltage input from the differential amplifying unit 121 to the ADC 122 has a voltage waveform that increases and decreases with the increase and decrease of the drive current Ipz.

Because the voltage of the analog signal input from the differential amplifying unit 121 is based on the drive current Ipz, the voltage contains operation information pertaining to the operation of the piezoelectric element 21. Therefore, the operation information obtainment unit 12 obtains the operation information in a discrete manner by the ADC 122 performing analog-digital conversion on the voltage of the analog signal input from the differential amplifying unit 121.

The control unit 11 is configured to perform feedback control of the drive parameters based on a representative value extracted from the operation information of the digital signal input from the ADC 122. The representative value is the average value of the operation information obtained discretely. More specifically, the control unit 11 calculates the average value of all digital signal values input from the ADC 122 during the operation information obtainment period AP and stores the average value as the representative value. The control unit 11 compares the representative value with a target value stored in advance, and performs feedback control of the drive parameters based on the comparison result.

The control unit 11 compares the representative value of the operation information obtained from the digital signal input from the operation information obtainment unit 12 with the target value stored in advance. If the representative value is the same as the target value or is within a predetermined error range, the control unit 11 maintains the current state without changing the drive parameters. On the other hand, if the representative value is smaller than the target value, the control unit 11 determines that the force generated by the piezoelectric element 21 is not the maximum, i.e., that the displacement of the piezoelectric element 21 is not the maximum value, and performs feedback controls of drive parameters so that the drive current flowing in the piezoelectric element 21 is increased. Additionally, if the representative value is larger than the target value, the control unit 11 determines that the displacement of the piezoelectric element 21 exceeds the maximum value, and performs feedback control of the drive parameters so that the drive current flowing in the piezoelectric element 21 is reduced. The greater the displacement of the piezoelectric element 21 is, the greater the output of the device that uses the piezoelectric actuator 20 as a driving source becomes. However, if the piezoelectric element 21 operates beyond its absolute maximum rated displacement, the piezoelectric actuator 20 may be damaged. Therefore, the piezoelectric actuator drive circuit 10 can prevent damage to the piezoelectric actuator 20 by performing feedback control of the drive parameters such that the drive current flowing in the piezoelectric element 21 is reduced when the representative value of the operation information is larger than the target value of the operation information.

Figure 11:
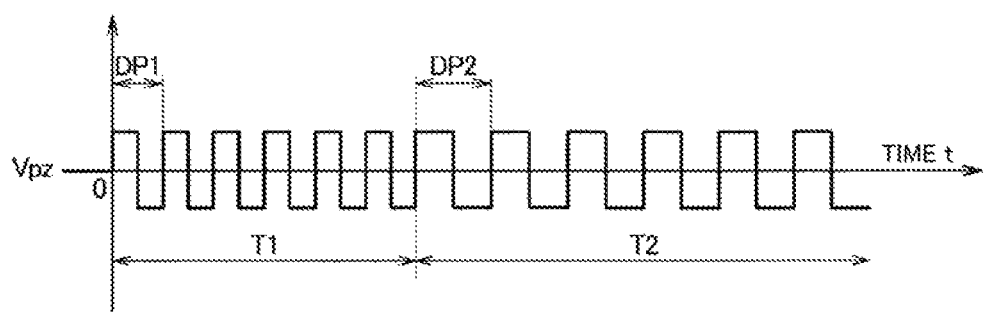
FIG. 11 illustrates a first specific example of feedback control in the actuator drive method, the piezoelectric actuator drive circuit, and the piezoelectric actuator drive system according to the first embodiment of the present disclosure.
Figure 12:
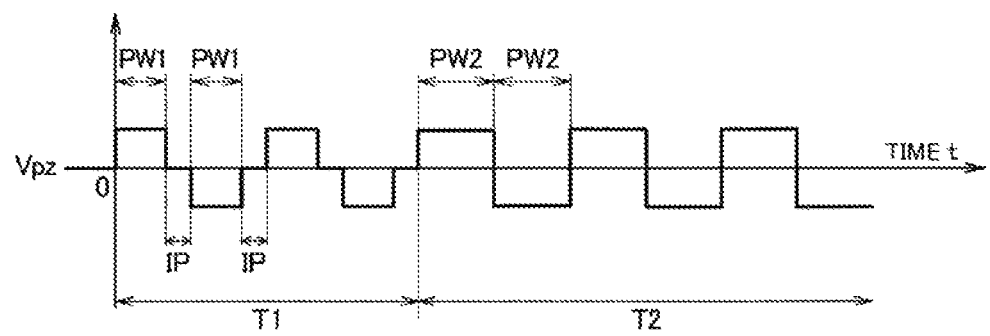
FIG. 12 illustrates a second specific example of feedback control in the actuator drive method, the piezoelectric actuator drive circuit, and the piezoelectric actuator drive system according to the first embodiment of the present disclosure.

Here, a specific example of the feedback control of the drive parameters of the piezoelectric element 21 in the piezoelectric actuator drive circuit 10 will be described with reference to FIGS. 11 and 12. FIGS. 11 and 12 illustrate the first and second specific examples of the feedback control, and illustrate the voltage waveform of the drive voltage Vpz for driving the piezoelectric element 21.

First Specific Example

In the first specific example of the feedback control in the piezoelectric actuator drive circuit 10, the drive parameter for driving the piezoelectric element 21 is the drive frequency for driving the piezoelectric element 21. More specifically, the control unit 11 performs feedback control of the drive frequency, which is the frequency of the drive voltage Vpz for driving the piezoelectric element 21, as the drive parameter, based on the comparison result between the representative value of the operation information obtained from the digital signal input from the operation information obtainment unit 12 and the target value of the operation information stored in advance.

As illustrated in FIG. 11, for example, in period T1, the representative value of the operation information obtained from the digital signal input from the operation information obtainment unit 12 is the same as, or within a predetermined error range of, the target value of the operation information stored in advance. The control unit 11 outputs a drive pulse signal to the H-bridge circuit 13 such that the cycle of the drive voltage Vpz for driving the piezoelectric element 21 becomes a cycle DP1 in an initial state. Because the H-bridge circuit 13 controls the transistors 131, 132, 133, and 134 on and off based on the drive pulse signal input from the control unit 11, the drive voltage Vpz of the drive frequency in the initial state can be applied to the piezoelectric element 21.

As illustrated in FIG. 11, for example, in period T2, the representative value of the operation information obtained from the digital signal input from the operation information obtainment unit 12 is smaller than the target value of the operation information stored in advance. The control unit 11 outputs a drive pulse signal to the H-bridge circuit 13 such that the cycle of the drive voltage Vpz for driving the piezoelectric element 21 becomes a cycle DP2, for example, which is longer than the cycle DP1 in the initial state. Because the H-bridge circuit 13 controls the transistors 131, 132, 133, and 134 on and off based on the drive pulse signal input from the control unit 11, the drive voltage Vpz of a drive frequency lower than the drive frequency in the initial state can be applied to the piezoelectric element 21.

In other words, in the first specific example of the feedback control in the piezoelectric actuator drive circuit 10, the drive parameter for driving the piezoelectric element 21 is the drive voltage Vpz for driving the piezoelectric element 21. As illustrated in FIG. 11, in the first specific example of feedback control in the piezoelectric actuator drive circuit 10, the configuration is such that feedback control of the drive parameters is performed by modulating the drive frequency of the drive voltage Vpz without changing the maximum amplitude of the drive voltage Vpz for driving the piezoelectric element 21.

Second Specific Example

In the second specific example of the feedback control in the piezoelectric actuator drive circuit 10, the drive parameter for driving the piezoelectric element 21 is a drive pulse width for driving the piezoelectric element 21. More specifically, the control unit 11 performs feedback control of the drive pulse width, which is the pulse width of the drive voltage Vpz for driving the piezoelectric element 21, as the drive parameter, based on the comparison result between the representative value of the operation information obtained from the digital signal input from the operation information obtainment unit 12 and the target value of the operation information stored in advance.

As illustrated in FIG. 12, for example, in period T1, the representative value of the operation information obtained from the digital signal input from the operation information obtainment unit 12 is the same as, or within a predetermined error range of, the target value of the operation information stored in advance. The control unit 11 outputs a drive pulse signal to the H-bridge circuit 13 such that an interval period IP is provided in which the voltage value becomes zero and the drive pulse width becomes a drive pulse width PW1 when the polarity of the drive voltage for driving the piezoelectric element 21 is inverted. Because the H-bridge circuit 13 controls the transistors 131, 132, 133, and 134 on and off based on the drive pulse signal input from the control unit 11, a drive voltage at the drive pulse width PW1 in the initial state can be applied to the piezoelectric element 21.

As illustrated in FIG. 12, for example, in period T2, the representative value of the operation information obtained from the digital signal input from the operation information obtainment unit 12 is smaller than the target value of the operation information stored in advance. The control unit 11 outputs a drive pulse signal to the H-bridge circuit 13 that can invert the polarity of the drive voltage Vpz without providing the interval period IP while also maintaining the length of one cycle of the drive voltage Vpz for driving the piezoelectric element 21. Because the H-bridge circuit 13 controls the transistors 131, 132, 133, and 134 on and off based on the drive pulse signal input from the control unit 11, the drive voltage Vpz at a drive pulse width PW2, which is longer than the drive pulse width PW1 in the initial state, can be applied to the piezoelectric element 21.

In other words, in the second specific example of the feedback control in the piezoelectric actuator drive circuit 10, the drive parameter for driving the piezoelectric element 21 is the drive voltage Vpz for driving the piezoelectric element 21. As illustrated in FIG. 12, in the second specific example of feedback control in the piezoelectric actuator drive circuit 10, the configuration is such that feedback control of the drive parameters is performed by modulating the drive pulse width of the drive voltage Vpz without changing the maximum amplitude of the drive voltage Vpz for driving the piezoelectric element 21.

Incidentally, in conventional techniques, in actuators that utilize the state of the piezoelectric element at the maximum amplitude, the drive frequency of the piezoelectric element may deviate from the maximum output frequency due to external disturbances, manufacturing variations, or the like. In this case, the vibration amplitude of the piezoelectric element is attenuated and the current waveform of the drive current flowing in the piezoelectric element also changes. Therefore, in the conventional piezoelectric actuator drive circuit, stable operation is realized by obtaining the value of the drive current and performing feedback control of the drive parameters according to the obtained value of the drive current.

A conventional piezoelectric actuator drive circuit normally uses a current detection circuit constituted by an op-amp, a capacitor, and the like, and obtains the drive current over the entire interval of one operation cycle of the piezoelectric element Therefore, even if the drive frequency of the piezoelectric element deviates from the maximum output frequency and the drive current flowing in the piezoelectric element changes from a resistive component to a capacitive component, the change cannot be captured based on the obtained value of the drive current. As a result, the conventional piezoelectric actuator drive circuit has a problem in that it is difficult to perform feedback control to bring the piezoelectric element to an optimal drive state.

In contrast, the piezoelectric actuator drive circuit according to the present embodiment is provided with an obtainment unit that obtains operation information pertaining to the operation of the piezoelectric element during a period that is a part of a drive cycle in which the piezoelectric element is driven, and a control unit that performs feedback control of the drive parameters for driving the piezoelectric element based on the operation information. Therefore, the piezoelectric actuator drive circuit according to the present embodiment can obtain the operation information of the piezoelectric element (e.g., the current value of the drive current) limited to the time domain in a state where the piezoelectric element generates a maximum amplitude (i.e., the generation of the drive current by the piezoelectric effect of the piezoelectric element is at a maximum). As a result, the piezoelectric actuator drive circuit according to the present embodiment can detect, with high accuracy, whether the piezoelectric element is in a maximum amplitude state or non-maximum amplitude state.

By obtaining the detailed operating state of the piezoelectric element and performing feedback control to drive the piezoelectric element in an optimal state, a piezoelectric actuator in which the vibration amount of the piezoelectric element is always maximum and which operates efficiently can be realized. Furthermore, the piezoelectric actuator drive circuit according to the present embodiment can drive the piezoelectric element even more efficiently by driving the piezoelectric element with a drive voltage having a rectangular voltage waveform.

Additionally, the piezoelectric actuator drive system according to the present embodiment is provided with a piezoelectric element, as well as a piezoelectric actuator drive circuit including an operation information obtainment unit that obtains operation information pertaining to the operation of the piezoelectric element during a period that is a part of a drive cycle in which the piezoelectric element is driven, and a control unit that performs feedback control of the drive parameters for driving the piezoelectric element based on the operation information. Accordingly, the piezoelectric actuator drive system according to the present embodiment provides similar effects to those of the piezoelectric actuator drive circuit according to the present embodiment.

(First Variation)

Next, a piezoelectric actuator drive circuit and a piezoelectric actuator drive system according to a first variation on the present embodiment will be described with reference to FIG. 13, with further reference to FIG. 8. The piezoelectric actuator drive circuit and the piezoelectric actuator drive system according to the present variation have a feature of continuously obtaining and storing the operation information pertaining to the operation of the piezoelectric element.

Aside from the configuration of the operation information obtainment unit being different, the piezoelectric actuator drive circuit and the piezoelectric actuator drive system according to the present variation have the same configuration as the piezoelectric actuator drive circuit 10 according to the present embodiment. Therefore, the descriptions of the piezoelectric actuator drive circuit according to the present variation will use the reference signs of the constituent elements provided in the piezoelectric actuator drive circuit 10 illustrated in FIG. 8.

Figure 13:
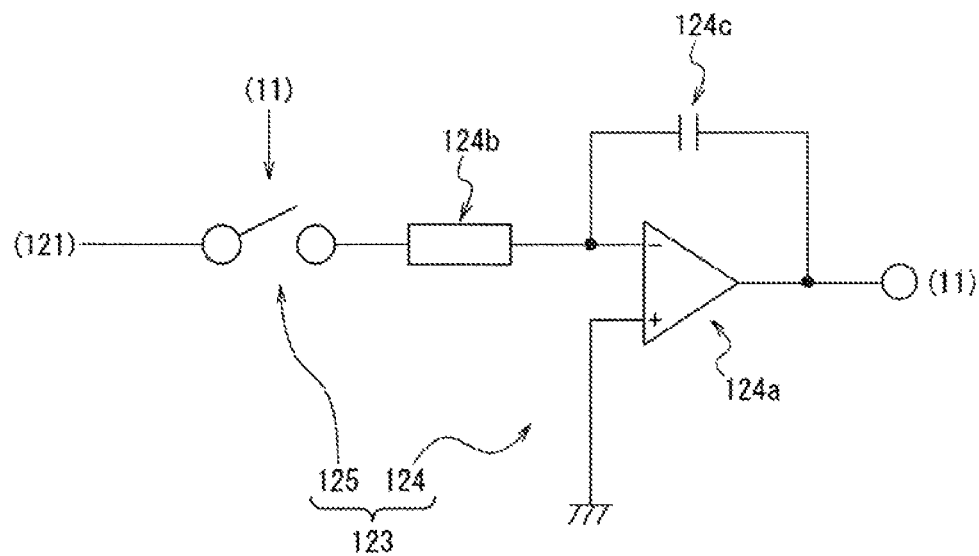
FIG. 13 is a diagram illustrating an example of the circuit configuration of the piezoelectric actuator drive circuit and a drive current extraction unit in the piezoelectric actuator drive system according to a first variation on the first embodiment of the present disclosure.

FIG. 13 is a circuit diagram illustrating the overall configuration of a drive current extraction unit 123 in the operation information obtainment unit (an example of an obtainment unit) provided in the piezoelectric actuator drive circuit according to the present variation.

As illustrated in FIG. 13, the drive current extraction unit 123 includes a switch element 125 connected to the output terminal of the differential amplifying unit 121 (not shown in FIG. 13; see FIG. 8). The drive current extraction unit 123 also has an integrating circuit 124 disposed between the switch element 125 and the control unit 11 (not shown in FIG. 13; see FIG. 8).

The input terminal of the switch element 125 is connected to the output terminal of the differential amplifying unit 121, and the output terminal of the switch element 125 is connected to the input terminal of the integrating circuit 124. The switch element 125 is controlled to switch between an on state (a conductive state) and an off state (a non-conductive state) by a control signal input from the control unit 11.

As illustrated in FIG. 13, the integrating circuit 124 includes an amplifier 124a constituted by, for example, an op-amp; a resistance element 124b connected to an inverting input terminal (−) of the amplifier 124a; and a capacitor 124c connected between the inverting input terminal (−) of the amplifier 124a and the output terminal of the amplifier 124a. A non-inverting input terminal (+) of the amplifier 124a is grounded. The output terminal of the amplifier 124a is connected to the input terminal of the control unit 11. One terminal of the resistance element 124b is connected to the output terminal of the switch element 125. The other terminal of the resistance element 124b is connected to the inverting input terminal (−) of the amplifier 124a and one electrode of the capacitor 124c. Therefore, one terminal of the resistance element 124b becomes the input terminal of the integrating circuit 124. The other electrode of the capacitor 124c is connected to the output terminal of the amplifier 124a and the input terminal of the control unit 11.

When the switch element 125 is in the on state, the drive current extraction unit 123 can extract a voltage proportional to the inverse of a value obtained by integrating the voltage input from the differential amplifying unit 121 with the resistance value of the resistance element 124b and the capacitance value of the capacitor 124c. Therefore, the drive current extraction unit 123 can continuously obtain and store the drive current flowing in the piezoelectric element 21 as an analog voltage by controlling the switch element 125 to the on state during the operation information obtainment period AP. The analog voltage output from the drive current extraction unit 123 contains drive information pertaining to the driving of the piezoelectric element. Therefore, the control unit 11 is configured to perform feedback control of the drive parameters based on the comparison result between the analog voltage input from the drive current extraction unit 123 and a target value of the drive information stored in advance as an analog voltage value. In the present variation, based on the comparison result from the control unit 11, feedback control of the drive parameters can be performed through a similar method to that used in the above-described first specific example and second specific example.

(Second Variation)

Next, a piezoelectric actuator drive circuit and a piezoelectric actuator drive system according to a second variation on the present embodiment will be described with reference to FIG. 14, with further reference to FIG. 8. The piezoelectric actuator drive circuit and the piezoelectric actuator drive system according to the present variation have a feature in that the drive parameter for driving the piezoelectric element is the drive voltage for driving the piezoelectric element, and feedback control of the drive parameter is performed by switching the maximum amplitude of the drive voltage between at least two potentials having different values.

Aside from the configuration of the H-bridge circuit 13 being different, the piezoelectric actuator drive circuit and the piezoelectric actuator drive system according to the present variation have the same configuration as the piezoelectric actuator drive circuit 10 according to the present embodiment. Therefore, the descriptions of the piezoelectric actuator drive circuit according to the present variation will use the reference signs of the constituent elements provided in the piezoelectric actuator drive circuit 10 illustrated in FIG. 8.

The piezoelectric actuator drive circuit and the piezoelectric actuator drive system according to the present variation have a voltage-variable DC power supply in the H-bridge circuit 13 such that the maximum amplitude of the drive voltage for driving the piezoelectric element can be switched. The voltage-variable DC power supply is capable of switching output between DC voltages having two or more voltage values. The voltage-variable DC power supply is configured to output a DC voltage of any one of the two or more voltage values, under the control of the control unit 11.

Figure 14:
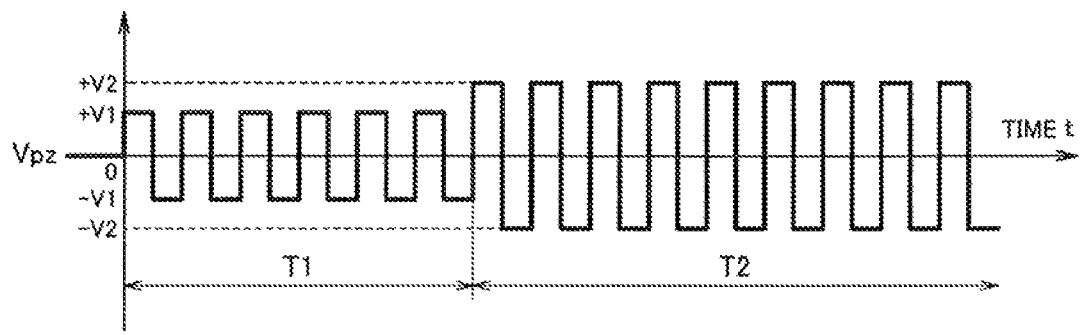
FIG. 14 illustrates an example of feedback control in the actuator drive method, the piezoelectric actuator drive circuit, and the piezoelectric actuator drive system according to a second variation on the first embodiment of the present disclosure.

FIG. 14 is a diagram illustrating the feedback control of the drive parameters of the piezoelectric element 21 in the piezoelectric actuator drive circuit and the piezoelectric actuator drive system according to the present variation, and illustrates the voltage waveform of the drive voltage Vpz for driving the piezoelectric element 21.

As illustrated in FIG. 14, for example, in period T1, the representative value of the operation information obtained from the digital signal input from the operation information obtainment unit 12 is the same as, or within a predetermined error range of, the target value of the operation information stored in advance. The control unit 11 outputs a drive pulse signal to the H-bridge circuit 13 such that the cycle of the drive voltage Vpz for driving the piezoelectric element 21 becomes a cycle in an initial state. Furthermore, the control unit 11 outputs a control signal to the H-bridge circuit 13 such that the voltage value of the maximum amplitude of the drive voltage Vpz for driving the piezoelectric element 21 becomes a voltage value V1 in an initial state. The H-bridge circuit 13 controls the transistors 131, 132, 133, and 134 on and off based on the drive pulse signal input from the control unit 11, and also selects the voltage value of the output voltage of the voltage-variable DC voltage. Through this, the H-bridge circuit 13 can apply the drive voltage Vpz in the initial state, where the absolute value of the voltage is the voltage value V1, to the piezoelectric element 21.

As illustrated in FIG. 14, for example, in period T2, the representative value of the operation information obtained from the digital signal input from the operation information obtainment unit 12 is smaller than the target value of the operation information stored in advance. The control unit 11 outputs a control signal to the H-bridge circuit 13 that puts the voltage value of the maximum amplitude of the drive voltage Vpz to a voltage value V2, which is higher than the voltage value V1 in the initial state, while maintaining the cycle of the drive voltage Vpz for driving the piezoelectric element 21. The H-bridge circuit 13 controls the transistors 131, 132, 133, and 134 on and off based on the drive pulse signal input from the control unit 11, and also selects the voltage value V2 of the output voltage of the voltage-variable DC voltage. Through this, the H-bridge circuit 13 can apply the drive voltage Vpz, where the absolute value of the voltage is the voltage value V2, to the piezoelectric element 21.

In this manner, the piezoelectric actuator drive circuit and the piezoelectric actuator drive system according to the present variation perform feedback control of the drive parameters by switching the maximum amplitude of the drive voltage for driving the piezoelectric element between two or more potentials having different values (in this example, the voltage value V1 and the voltage value V2). In the present variation, there are two potentials for the maximum amplitude of the drive voltage, namely the voltage value V1 and the voltage value V2, but of course three or more may also be used. Additionally, in the present variation, when switching the maximum amplitude of the drive voltage, the drive frequency for driving the piezoelectric element 21 and the drive pulse width of the drive voltage are not changed, but at least one of the drive frequency and the drive pulse width may be changed.

The piezoelectric actuator drive circuit and the piezoelectric actuator drive system according to the present variation can also be applied to a case where the operation information is continuously obtained as in the piezoelectric actuator drive circuit and the piezoelectric actuator drive system according to the above-described first variation.

As described thus far, the piezoelectric actuator drive circuit according to the first variation and the second variation is provided with an obtainment unit that obtains operation information pertaining to the operation of the piezoelectric element during a period that is a part of a drive cycle in which the piezoelectric element is driven, and a control unit that performs feedback control of the drive parameters for driving the piezoelectric element based on the operation information. Additionally, the piezoelectric actuator drive system according to the first variation and the second variation is provided with a piezoelectric element, as well as a piezoelectric actuator drive circuit including an operation information obtainment unit that obtains operation information pertaining to the operation of the piezoelectric element during a period that is a part of a drive cycle in which the piezoelectric element is driven, and a control unit that performs feedback control of the drive parameters for driving the piezoelectric element based on the operation information. Accordingly, the piezoelectric actuator drive circuit and the piezoelectric actuator drive system according to the first variation and the second variation provide similar effects to those of the piezoelectric actuator drive circuit and the piezoelectric actuator drive system according to the above-described embodiment.

(Piezoelectric Actuator Drive Method)

Figure 15:
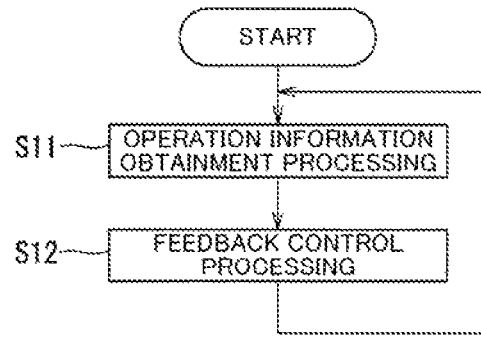
FIG. 15 is a flowchart illustrating an example of the flow of the piezoelectric actuator drive method according to the first embodiment of the present disclosure.

A piezoelectric actuator drive method according to the present embodiment will be described next with reference to FIG. 15, with further reference to FIGS. 8 to 14. FIG. 15 is a flowchart illustrating an example of the flow of the piezoelectric actuator drive method according to the present embodiment. The processing illustrated in FIG. 15 is controlled by the control unit 11 (see FIG. 8) provided in the piezoelectric actuator drive circuit 10 according to the present embodiment.

As illustrated in FIG. 15, in the piezoelectric actuator drive method according to the present embodiment, when the power of the piezoelectric actuator drive circuit 10 is turned on, operation information obtainment processing is first executed in step S11, and the processing then moves to step S12. In the operation information obtainment processing, the control unit 11 obtains the operation information pertaining to the operation of the piezoelectric element 21 (see FIG. 8) in the operation information obtainment period (an example of a period that is part of one cycle of the drive cycle in which the piezoelectric element is driven) AP for obtaining the operation information pertaining to the operation of the piezoelectric element 21 (see FIG. 10). In the first operation information obtainment processing after the power of the piezoelectric actuator drive circuit 10 is turned on, the control unit 11 drives the piezoelectric element 21 with the drive voltage in the initial state, and obtains the operation information. The control unit 11 controls the operation information obtainment unit 12 (see FIG. 8) to obtain the operation information. As described above, in the present embodiment, the control unit 11 obtains the drive current flowing in the piezoelectric element 21 as the operation information. At this time, the control unit 11 obtains the operation information by converting the drive current flowing in the piezoelectric element 21 into a voltage using the resistance element 14 (see FIG. 8).

As described above, the operation information obtainment unit 12 may obtain the operation information continuously (see FIG. 13) or discretely (see FIG. 8). The control unit 11 may perform feedback control of the drive parameters based on a representative value (e.g., an average value) extracted from the obtained operation information when the operation information is discretely obtained by the operation information obtainment unit 12.

In step S12, feedback control processing is executed, and the processing then returns to step S11. In step S12, the control unit 11 performs feedback control of the drive parameters for driving the piezoelectric element 21 based on the operation information obtained by the operation information obtainment unit 12. As described above, the control unit 11 can use the drive voltage, the drive frequency, the drive pulse width, and the like for driving the piezoelectric element 21 as drive parameters (see FIGS. 11 and 12). Additionally, as described above, when the drive voltage for driving the piezoelectric element 21 is used as the drive parameter, the control unit 11 may perform feedback control of the drive parameter by modulating the drive frequency, modulating the drive pulse width, or modulating both the drive frequency and the drive pulse width without changing the maximum amplitude of the drive voltage. Additionally, as described above, when the drive voltage for driving the piezoelectric element 21 is used as the drive parameter, the control unit 11 may perform feedback control of the drive parameter by switching the maximum amplitude of the drive voltage between two or more potentials having different values without changing the drive frequency.

The control unit 11 repeatedly executes step S11 and step S12 while the piezoelectric actuator drive circuit 10 is powered on. As a result, the piezoelectric actuator drive method according to the present embodiment can efficiently operate the piezoelectric actuator by driving the piezoelectric element in an optimal state and maximizing the amount of vibration of the piezoelectric element at all times.

Second Embodiment

A piezoelectric actuator drive method, a piezoelectric actuator drive circuit, and a piezoelectric actuator drive system according to a second embodiment of the present disclosure will be described with reference to FIGS. 16 and 17. The piezoelectric actuator drive method, the piezoelectric actuator drive circuit, and the piezoelectric actuator drive system according to the present embodiment have a feature in that at least one of the discharge pressure and a discharge flow rate of a device having a piezoelectric actuator (e.g., a piezoelectric pump, a piezoelectric ultrasonic device, or the like) is used as the operation information, instead of the drive current flowing in the piezoelectric element. A piezoelectric pump will be described as an example of the device having the piezoelectric actuator in the present embodiment.

Figure 16:
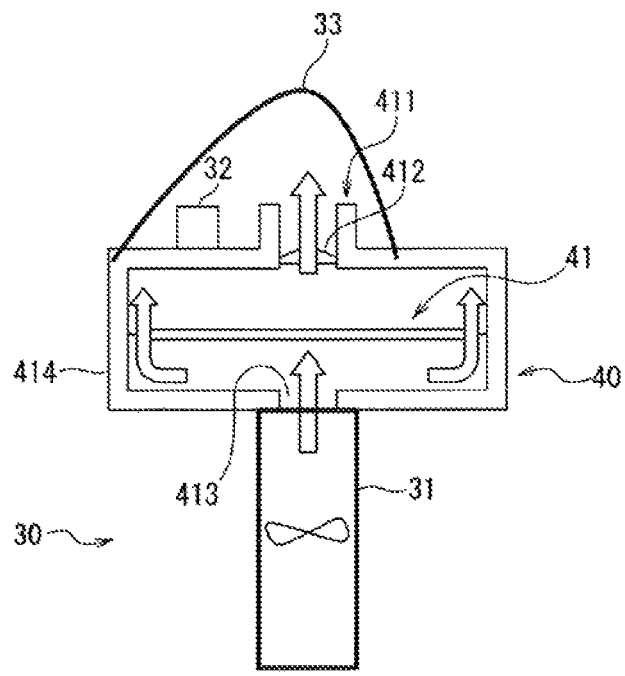
FIG. 16 is a diagram illustrating the overall configuration of a piezoelectric pump which is to be driven by a piezoelectric actuator drive circuit and a piezoelectric actuator drive system according to a second embodiment of the present disclosure.

FIG. 16 is a diagram illustrating the piezoelectric actuator drive circuit and the piezoelectric actuator drive system according to the present embodiment, and is a schematic diagram illustrating the overall configuration of the piezoelectric pump to be driven. In FIG. 16, the flow of air is illustrated with bold arrows to facilitate understand.

As illustrated in FIG. 16, the piezoelectric actuator drive circuit and the piezoelectric actuator drive system according to the present embodiment include a flow rate change detection unit 31 that detects a change in a flow rate of air flowing in a piezoelectric actuator 40, and a discharge pressure detection unit 32 that detects a discharge pressure of air discharged from the piezoelectric actuator 40. Aside from including the flow rate change detection unit 31 and the discharge pressure detection unit 32 instead of the resistance element 14, the piezoelectric actuator drive circuit and the piezoelectric actuator drive system according to the present embodiment have the same configuration as the piezoelectric actuator drive circuit according to the above-described first embodiment, and illustrations and detailed descriptions will therefore not be given. The piezoelectric actuator drive circuit and the piezoelectric actuator drive system according to the present embodiment are configured to obtain at least one of a change in the flow rate of the air, detected by the flow rate change detection unit 31, and the discharge pressure, detected by the discharge pressure detection unit 32, as the operation information pertaining to the operation of the piezoelectric element 41. The piezoelectric actuator drive circuit and the piezoelectric actuator drive system according to the present embodiment are capable of executing feedback control similar to the piezoelectric actuator drive circuit and the piezoelectric actuator drive system according to the above-described first embodiment by converting at least one of the change in the flow rate of the air detected by the flow rate change detection unit 31 and the discharge pressure detected by the discharge pressure detection unit 32 into an analog voltage, for example.

As illustrated in FIG. 16, a piezoelectric pump 30 includes the piezoelectric actuator 40, which uses a piezoelectric element 41 as the driving actuator. The piezoelectric pump 30 has a cover part 33 attached to the piezoelectric actuator 40 so as to cover an exhaust port 411 and the discharge pressure detection unit 32 of the piezoelectric actuator 40. The cover part 33 is capable of deforming according to the discharge pressure.

A main body part 414 of the piezoelectric actuator 40 has a box shape provided with an internal space. The piezoelectric element 41 is attached to what is substantially the center of the internal space of the main body part 414. A space through which air can flow is provided between the piezoelectric element 41 and the inner surface of a side wall of the main body part 414. The piezoelectric element 41 has the same configuration as the piezoelectric element 21 in the above-described first embodiment. Although not illustrated, a piezoelectric actuator drive circuit having the same configuration as the piezoelectric actuator drive circuit 10 according to the above-described first embodiment is connected to the piezoelectric element 41. This makes it possible for the piezoelectric element 41 to vibrate when an AC drive voltage is applied.

An inlet 413 is formed on the upstream side of the piezoelectric actuator 40. The flow rate change detection unit 31 is attached so as to cover the inlet 413. The exhaust port 411 is formed on the downstream side of the piezoelectric actuator 40, with the piezoelectric element 41 provided therebetween. A valve 412 is attached to the inside of the exhaust port 411.

The piezoelectric element 41 vibrates when an AC drive voltage having a rectangular voltage waveform, for example, is applied. When the piezoelectric element 41 vibrates, the air flowing from the flow rate change detection unit 31 into the internal space of the main body part 414 of the piezoelectric actuator 40 moves to the exhaust port 411 while being compressed and expanded. As the piezoelectric element 41 vibrates, the ease with which air can flow into the internal space of the main body part 414 of the piezoelectric actuator 40 changes. The flow rate change detection unit 31 detects the change in flow rate based on this change in the ease of air inflow. The discharge pressure detection unit 32 detects the discharge pressure based on a pressure difference between the air input and output at the valve 412 attached to the exhaust port 411.

Figure 17:
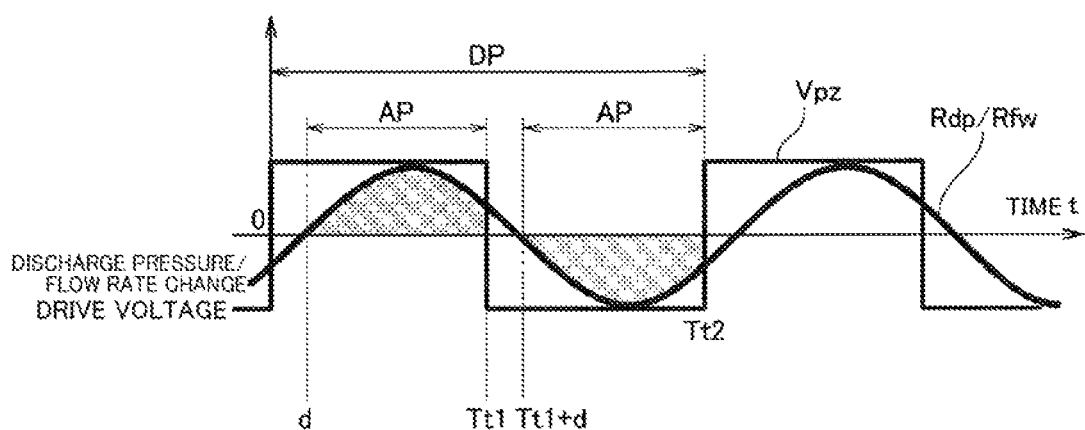
FIG. 17 is a diagram illustrating a piezoelectric actuator drive method, the piezoelectric actuator drive circuit, and the piezoelectric actuator drive system according to the second embodiment of the present disclosure, and schematically illustrating an example of a voltage waveform of a drive voltage for driving a piezoelectric element, as well as a waveform of a discharge pressure and a change in the flow rate of air of a piezoelectric pump.

FIG. 17 schematically illustrates an example of the voltage waveform of the drive voltage for driving the piezoelectric element 41 and waveforms of the discharge pressure and the change in the flow rate of the air in the piezoelectric pump 30. In the piezoelectric pump 30, air movement always occurs in the internal space of the main body part 414 of the piezoelectric actuator 40 with a predetermined delay in response to the drive voltage applied to the piezoelectric element 41. Therefore, in the piezoelectric pump 30, the change in the flow rate of the air flowing into the piezoelectric actuator 40 and the discharge pressure of the air discharged from the piezoelectric actuator 40 have a predetermined delay with respect to the drive voltage applied to the piezoelectric element 41.

In other words, as illustrated in FIG. 17, a discharge pressure Pdp for obtaining the operation information has a waveform in which the discharge pressure becomes zero at a point in time delayed by a time d from the point in time when the polarity of the drive voltage Vpz inverts. The discharge pressure from the piezoelectric actuator 40 when the polarity of the drive voltage Vpz inverts is caused almost not at all by the obtainment of effective discharge pressure information. Accordingly, the longest period that can be set as the operation information obtainment period (an example of a period that is a part of one cycle of the drive cycle in which the piezoelectric element is driven) for obtaining operation information pertaining to the operation of the piezoelectric element 41 is from time d to time Tt1 or from time Tt1+d to time Tt2. Time Tt1 is the time of the timing corresponding to half of one cycle DP of the drive voltage, and time Tt2 is the time of the timing corresponding to one cycle DP of the drive voltage.

Similarly, a flow rate change Pfw for obtaining the operation information has a waveform in which the flow rate change becomes zero at a point in time delayed by a time d from the point in time when the polarity of the drive voltage Vpz inverts. The air that flows into the piezoelectric actuator 40 when the polarity of the drive voltage Vpz inverts contributes almost not at all to the obtainment of effective flow rate change information. Accordingly, the longest period that can be set as the operation information obtainment period (an example of a period that is a part of one cycle of the drive cycle in which the piezoelectric element is driven) for obtaining operation information pertaining to the operation of the piezoelectric element 41 is from time d to time Tt1 or from time Tt1+d to time Tt2. Time Tt1 is the time of the timing corresponding to half of one cycle DP of the drive voltage, and time Tt2 is the time of the timing corresponding to one cycle DP of the drive voltage.

In both the case where the discharge pressure is obtained as the operation information or the flow rate change is obtained as the operation information, the operation information (i.e., information on the discharge pressure or information on the flow rate change) is obtained during either the period from time d to time Tt1 or the period from time Tt1+d to time Tt2 in order to simplify the circuit configuration of the operation information obtainment unit. Although the delay time in the discharge pressure Pdp and the delay time in the flow rate change Pfw are both time d in FIG. 17, the delay time for both may differ depending on the structure of the piezoelectric pump 30 and the like.

Aside from the operation information being different, the piezoelectric actuator drive method according to the present embodiment is the same as the piezoelectric actuator drive method according to the above-described first embodiment (see FIG. 16), and will therefore not be described.

As described above, the piezoelectric actuator drive method according to the present embodiment obtains operation information pertaining to the operation of the piezoelectric element during a period that is a part of one cycle of a drive cycle in which the piezoelectric element is driven, and performs feedback control of the drive parameters for driving the piezoelectric element based on the operation information. Additionally, the piezoelectric actuator drive circuit according to the present embodiment is provided with an obtainment unit that obtains operation information pertaining to the operation of the piezoelectric element during a period that is a part of a drive cycle in which the piezoelectric element is driven, and a control unit that performs feedback control of the drive parameters for driving the piezoelectric element based on the operation information. Furthermore, the piezoelectric actuator drive system according to the present embodiment is provided with a piezoelectric element, as well as a piezoelectric actuator drive circuit including an operation information obtainment unit that obtains operation information pertaining to the operation of the piezoelectric element during a period that is a part of a drive cycle in which the piezoelectric element is driven, and a control unit that performs feedback control of the drive parameters for driving the piezoelectric element based on the operation information.

Accordingly, the piezoelectric actuator drive method, the piezoelectric actuator drive circuit, and the piezoelectric actuator drive system according to the present embodiment provide similar effects to those of the piezoelectric actuator drive method, the piezoelectric actuator drive circuit, and the piezoelectric actuator drive system according to the above-described first embodiment. In addition, the piezoelectric actuator drive method, the piezoelectric actuator drive circuit, and the piezoelectric actuator drive system according to the present embodiment can control the vibration state of the piezoelectric element with a high level of accuracy by extracting discharge pressure and flow rate change components effective for producing air.

Third Embodiment

A piezoelectric actuator drive method, a piezoelectric actuator drive circuit, and a piezoelectric actuator drive system according to a third embodiment of the present disclosure will be described with reference to FIGS. 18 and 19. The piezoelectric actuator drive method, the piezoelectric actuator drive circuit, and the piezoelectric actuator drive system according to the present embodiment have a feature in that a change in a reflected light amount based on vibration of the piezoelectric element provided in the piezoelectric actuator is used as the operation information, instead of the drive current flowing in the piezoelectric element. A piezoelectric pump will be described as an example of the device having the piezoelectric actuator in the present embodiment.

Figure 18:
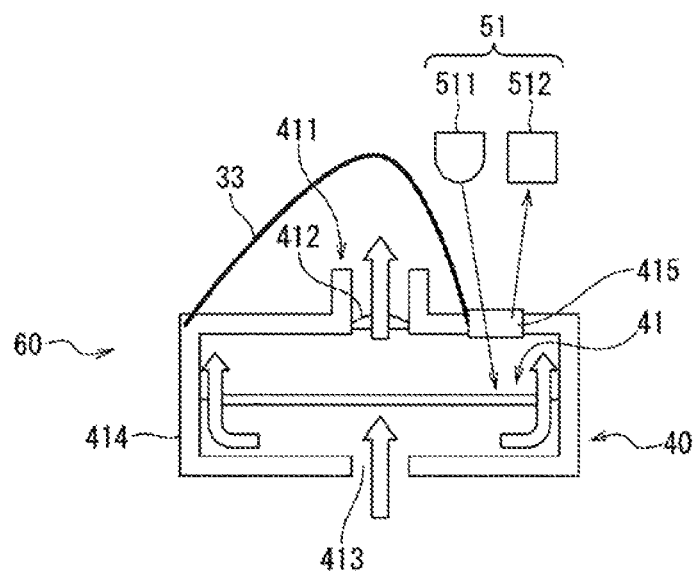
FIG. 18 is a diagram illustrating the overall configuration of a piezoelectric pump which is to be driven by a piezoelectric actuator drive circuit and a piezoelectric actuator drive system according to a third embodiment of the present disclosure.

FIG. 18 is a diagram illustrating the piezoelectric actuator drive circuit and the piezoelectric actuator drive system according to the present embodiment, and is a schematic diagram illustrating the overall configuration of the piezoelectric pump to be driven. In FIG. 18, the flow of air is illustrated with bold arrows to facilitate understand.

As illustrated in FIG. 18, the piezoelectric actuator drive circuit and the piezoelectric actuator drive system according to the present embodiment include a reflected light amount detection unit 51 that detects a change in a reflected light amount based on the vibration of the piezoelectric element 41 provided in the piezoelectric actuator 40. Aside from including the reflected light amount detection unit 51 instead of the resistance element 14, the piezoelectric actuator drive circuit and the piezoelectric actuator drive system according to the present embodiment have the same configuration as the piezoelectric actuator drive circuit according to the above-described first embodiment, and illustrations and detailed descriptions will therefore not be given. The piezoelectric actuator drive circuit and the piezoelectric actuator drive system according to the present embodiment are configured to obtain a change in the amount of reflected light, detected by the reflected light amount detection unit 51, as the operation information pertaining to the operation of the piezoelectric element 41. The piezoelectric actuator drive circuit and the piezoelectric actuator drive system according to the present embodiment are capable of executing feedback control similar to the piezoelectric actuator drive circuit and the piezoelectric actuator drive system according to the above-described first embodiment by converting the amount of reflected light detected by the reflected light amount detection unit 51 into an analog voltage, for example.

As illustrated in FIG. 18, the reflected light amount detection unit 51 includes a light source 511 disposed so as to be capable of irradiating the piezoelectric element 41 with light, and a light receiving unit 512 disposed so as to be capable of receiving light reflected by the piezoelectric element 41. The light source 511 is constituted by a light-emitting diode, for example. The light receiving unit 512 is constituted by a photodiode, for example.

Aside from lacking the flow rate change detection unit 31 and the discharge pressure detection unit 32, and including a light entry/exit part 415, a piezoelectric pump 60 according to the present embodiment has the same configuration as the piezoelectric pump 30 in the above-described second embodiment, and thus constituent elements providing the same actions and functions are given the same reference signs and will not be described.

As illustrated in FIG. 18, the piezoelectric actuator 40 has the light entry/exit part 415 formed in the main body part 414. The light entry/exit part 415 is configured to be capable of transmitting light toward the piezoelectric element 41. The light source 511 is disposed with a light-emitting unit (not shown) facing the light entry/exit part 415. The light receiving unit 512 is disposed with a light receiving surface (not shown) facing the light entry/exit part 415. Accordingly, the light source 511 can emit light onto the piezoelectric element 41 through the light entry/exit part 415. The light receiving unit 512 can receive the light reflected by the piezoelectric element 41 through the light entry/exit part 415.

The piezoelectric element 41 vibrates while the surface thereof flexes, and the flexion of the surface changes according to the amount of displacement caused by the vibration. Therefore, the incident angle of the light incident on the piezoelectric element 41 changes according to the amount of displacement caused by the vibration of the piezoelectric element 41, and the reflection angle of the reflected light reflected by the piezoelectric element 41 also changes according to the amount of displacement caused by the vibration of the piezoelectric element 41. As a result, the amount of the reflected light received by the light receiving unit 512 also changes in accordance with the amount of displacement caused by the vibration of the piezoelectric element 41. In this manner, the amount of displacement caused by the vibration of the piezoelectric element 41 can be detected by the reflected light amount detection unit 51 based on the amount of light reflected. In the present embodiment, the light receiving unit 512 is disposed such that the amount of the reflected light is maximum when, for example, the amount of displacement caused by the vibration of the piezoelectric element 41 is maximum.

Figure 19:
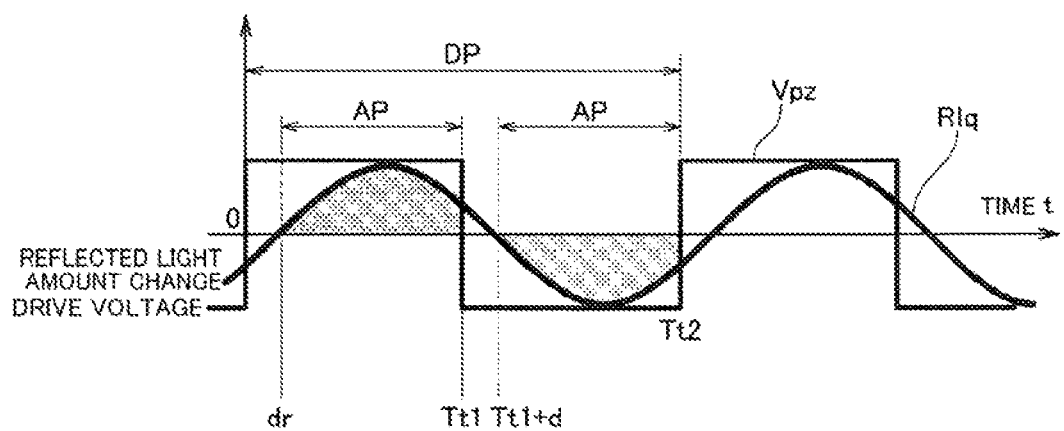
FIG. 19 is a diagram illustrating a piezoelectric actuator drive method, the piezoelectric actuator drive circuit, and the piezoelectric actuator drive system according to the third embodiment of the present disclosure, and schematically illustrating an example of a voltage waveform of a drive voltage for driving a piezoelectric element, as well as a voltage waveform of voltage based on a reflected light amount from the piezoelectric element.

FIG. 19 schematically illustrates an example of the voltage waveform of the drive voltage for driving the piezoelectric element 41 and a waveform of the reflected light amount in the piezoelectric pump 60. In the piezoelectric pump 60, the piezoelectric element 41 always vibrates with a predetermined delay with respect to the drive voltage applied to the piezoelectric element 41. Therefore, in the piezoelectric pump 60, the reflected light at the piezoelectric element 41 also has a predetermined delay with respect to the drive voltage applied to the piezoelectric element 41.

In other words, as illustrated in FIG. 19, a reflected light amount change Rlq for obtaining the operation information has a waveform in which the reflected light amount change Rlq becomes zero at a point in time delayed by a time dr from the point in time when the polarity of the drive voltage Vpz inverts. The reflected light amount from the piezoelectric element 41 when the polarity of the drive voltage Vpz inverts contributes almost not at all to the obtainment of effective information on the change in the reflected light amount. Accordingly, the longest period that can be set as the operation information obtainment period (an example of a period that is a part of one cycle of the drive cycle in which the piezoelectric element is driven) AP for obtaining operation information pertaining to the operation of the piezoelectric element 41 is from time dr to time Tr1 or from time Tr1+dr to time Tr2. Time Tr1 is the time of the timing corresponding to half of one cycle DP of the drive voltage, and time Tr2 is the time of the timing corresponding to one cycle DP of the drive voltage. In the present embodiment, too, to simplify the circuit configuration of the operation information obtainment unit, the operation information (i.e., information on the change in the reflected light amount) is obtained in either the period from time dr to time Tr1 or the period from time Tr1+dr to time Tr2.

Aside from the operation information being different, the piezoelectric actuator drive method according to the present embodiment is the same as the piezoelectric actuator drive method according to the above-described first embodiment (see FIG. 16), and will therefore not be described.

As described above, the piezoelectric actuator drive method according to the present embodiment obtains operation information pertaining to the operation of the piezoelectric element during a period that is a part of one cycle of a drive cycle in which the piezoelectric element is driven, and performs feedback control of the drive parameters for driving the piezoelectric element based on the operation information. Additionally, the piezoelectric actuator drive circuit according to the present embodiment is provided with an obtainment unit that obtains operation information pertaining to the operation of the piezoelectric element during a period that is a part of a drive cycle in which the piezoelectric element is driven, and a control unit that performs feedback control of the drive parameters for driving the piezoelectric element based on the operation information. Furthermore, the piezoelectric actuator drive system according to the present embodiment is provided with a piezoelectric element, as well as a piezoelectric actuator drive circuit including an operation information obtainment unit that obtains operation information pertaining to the operation of the piezoelectric element during a period that is a part of a drive cycle in which the piezoelectric element is driven, and a control unit that performs feedback control of the drive parameters for driving the piezoelectric element based on the operation information.

Accordingly, the piezoelectric actuator drive method, the piezoelectric actuator drive circuit, and the piezoelectric actuator drive system according to the present embodiment provide similar effects to those of the piezoelectric actuator drive method, the piezoelectric actuator drive circuit, and the piezoelectric actuator drive system according to the above-described first embodiment. In addition, the piezoelectric actuator drive method, the piezoelectric actuator drive circuit, and the piezoelectric actuator drive system according to the present embodiment can control the vibration state of the piezoelectric element with a high level of accuracy by extracting a displacement change component of the piezoelectric element effective for producing air and the like.

Fourth Embodiment

A piezoelectric actuator drive method, a piezoelectric actuator drive circuit, and a piezoelectric actuator drive system according to a fourth embodiment of the present disclosure will be described with reference to FIGS. 20 to 22. The piezoelectric actuator drive method, the piezoelectric actuator drive circuit, and the piezoelectric actuator drive system according to the present embodiment have a feature in that a change in a movement amount of a slider that moves based on vibration of the piezoelectric element provided in the piezoelectric actuator is used as the operation information, instead of the drive current flowing in the piezoelectric element. A positioning mechanism will be described as an example of the device having the piezoelectric actuator in the present embodiment.

Figure 20:
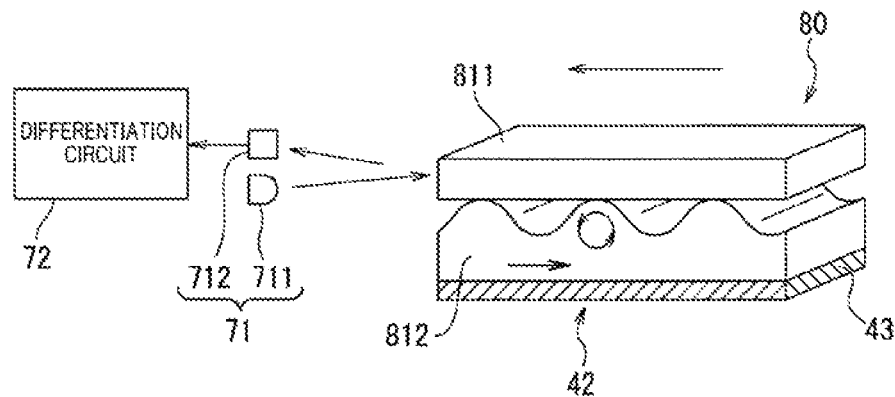
FIG. 20 is a diagram illustrating the overall configuration of a positioning mechanism which is to be driven by a piezoelectric actuator drive circuit and a piezoelectric actuator drive system according to a fourth embodiment of the present disclosure.
Figure 21:
FIG. 21 is a diagram illustrating a piezoelectric actuator drive method, the piezoelectric actuator drive circuit, and the piezoelectric actuator drive system according to the fourth embodiment of the present disclosure, and schematically illustrating an example of a voltage waveform of voltage based on a movement amount of the positioning mechanism.

FIG. 20 is a diagram illustrating the piezoelectric actuator drive circuit and the piezoelectric actuator drive system according to the present embodiment, and is a schematic diagram illustrating the overall configuration of the positioning mechanism to be driven.

As illustrated in FIG. 20, the piezoelectric actuator drive circuit and the piezoelectric actuator drive system according to the present embodiment include a movement amount detection unit 71 that detects a movement amount of a slider 811 based on vibration of a piezoelectric element 43 provided in a piezoelectric actuator 42. The piezoelectric actuator drive circuit and the piezoelectric actuator drive system also include a differentiation circuit 72 that differentiates an analog voltage based on the amount of movement detected by the movement amount detection unit 71. The differentiation circuit 72 is provided in the operation information obtainment unit 12 (see FIG. 8), for example, instead of the differential amplifying unit 121 (see FIG. 8). Aside from including the movement amount detection unit 71 instead of the resistance element 14 and the differentiation circuit 72 instead of the differential amplifying unit 121, the piezoelectric actuator drive circuit and the piezoelectric actuator drive system according to the present embodiment have the same configuration as the piezoelectric actuator drive circuit according to the above-described first embodiment, and illustrations and detailed descriptions will therefore not be given. The piezoelectric actuator drive circuit and the piezoelectric actuator drive system according to the present embodiment are configured to obtain a change in the amount of reflected light, detected by the movement amount detection unit 71, as the operation information pertaining to the operation of the piezoelectric element 43. The piezoelectric actuator drive circuit and the piezoelectric actuator drive system according to the present embodiment are capable of executing feedback control similar to the piezoelectric actuator drive circuit and the piezoelectric actuator drive system according to the above-described first embodiment by converting the amount of reflected light detected by the movement amount detection unit 71 into an analog voltage, for example.

As illustrated in FIG. 20, the movement amount detection unit 71 includes a light source 711 disposed so as to irradiate the slider 811 (described in detail later) provided in a positioning mechanism 80 with light, and a light receiving unit 712 disposed so as to receive reflected light reflected by the slider 811. The light source 711 is constituted by a light-emitting diode, for example. The light receiving unit 712 is constituted by a photodiode, for example. The movement amount detection unit 71 may have a range sensor instead of the light source 711 and the light receiving unit 712.

The light receiving unit 712 is configured to photoelectrically convert the received reflected light and output an analog voltage to the differentiation circuit 72. The differentiation circuit 72 can detect changes in the analog voltage (i.e., changes in the amount of the reflected light) by differentiating the analog voltage input from the light receiving unit 712.

As illustrated in FIG. 20, the positioning mechanism 80 includes the piezoelectric actuator 42 having the piezoelectric element 43, a stator 812 disposed on the piezoelectric actuator 42, and the slider 811 disposed on the stator 812. The positioning mechanism 80 uses the piezoelectric element 43 to generate ultrasonic vibrations in the stator 812, which moves the slider 811 through frictional force.

The piezoelectric actuator drive circuit according to the present embodiment can move the slider 811 in one direction by applying asymmetrical drive pulses to the piezoelectric element 43. In the movement amount detection unit 71, light can be emitted from the light source 711 onto the slider 811, and the reflected light reflected by the slider 811 can be received by the light receiving unit 712. Through this, the movement amount detection unit 71 can capture instantaneous changes in the movement of the slider 811.

The slider 811 moves, for example, in a direction approaching the movement amount detection unit 71. Therefore, as illustrated in FIG. 21, the voltage value of a voltage Vam photoelectrically converted by the light receiving unit 712 of the movement amount detection unit 71 increases in one direction, as indicated by the broken line arrows.

The piezoelectric actuator drive circuit according to the present embodiment includes the differentiation circuit 72, which can extract (differentiate or the like) components according to the drive pulse of the drive voltage for driving the piezoelectric element 43. Therefore, as illustrated in FIG. 22, a differential voltage Vdm output from the differentiation circuit 72 can extract only the change in the amount of the reflected light by removing the amount of the increase in one direction (see FIG. 21).

Figure 22:
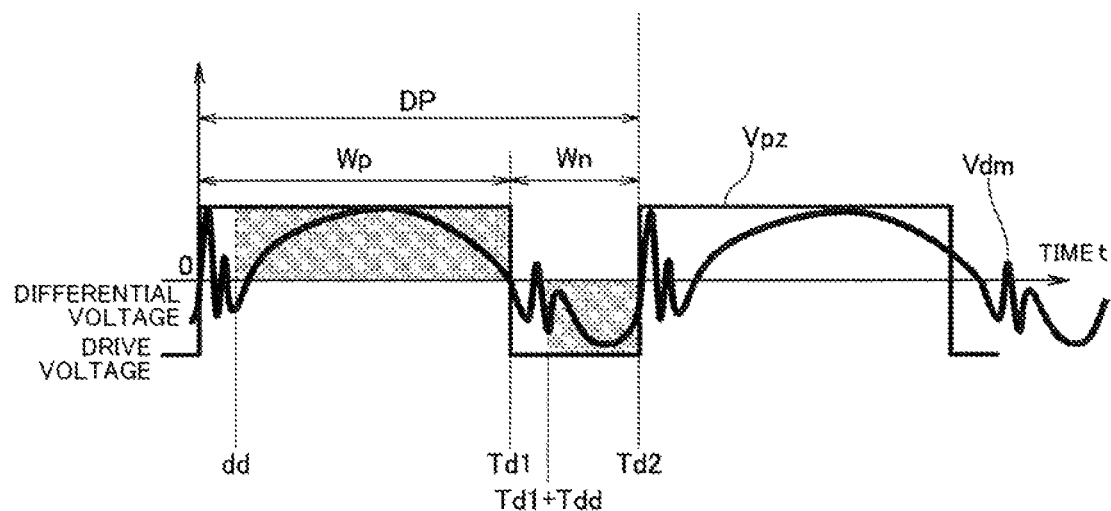
FIG. 22 is a diagram illustrating the piezoelectric actuator drive method, the piezoelectric actuator drive circuit, and the piezoelectric actuator drive system according to the fourth embodiment of the present disclosure, and schematically illustrating an example of a voltage waveform of a drive voltage for driving a piezoelectric element, as well as a voltage waveform of differential voltage based on a movement amount of the positioning mechanism.

As illustrated in FIG. 22, the differential voltage Vdm, which is differentiated by the differentiation circuit 72 from the voltage photoelectrically converted from the reflected light for obtaining the operation information, has a waveform that becomes zero at a point in time delayed by a time dd from the point in time when the polarity of the drive voltage Vpz for driving the piezoelectric element 43 inverts. Additionally, when the polarity of the drive voltage Vpz inverts, the movement of the slider 811 becomes irregular. Accordingly, the longest period that can be set as the operation information obtainment period (an example of a period that is a part of one cycle of the drive cycle in which the piezoelectric element is driven) AP for obtaining operation information pertaining to the operation of the piezoelectric element 43 is from time dd to time Td1 or from time Td1+dd to time Td2. Time Td1 is the time of the timing when the polarity of the drive voltage inverts from positive to negative in one cycle DP of the drive voltage. Time Td2 is the time of the timing when the polarity of the drive voltage inverts from negative to positive in one cycle DP of the drive voltage.

Aside from the operation information being different, the piezoelectric actuator drive method according to the present embodiment is the same as the piezoelectric actuator drive method according to the above-described first embodiment (see FIG. 16), and will therefore not be described.

As described above, the piezoelectric actuator drive method according to the present embodiment obtains operation information pertaining to the operation of the piezoelectric element during a period that is a part of one cycle of a drive cycle in which the piezoelectric element is driven, and performs feedback control of the drive parameters for driving the piezoelectric element based on the operation information. Additionally, the piezoelectric actuator drive circuit according to the present embodiment is provided with an obtainment unit that obtains operation information pertaining to the operation of the piezoelectric element during a period that is a part of a drive cycle in which the piezoelectric element is driven, and a control unit that performs feedback control of the drive parameters for driving the piezoelectric element based on the operation information. Furthermore, the piezoelectric actuator drive system according to the present embodiment is provided with a piezoelectric element, as well as a piezoelectric actuator drive circuit including an operation information obtainment unit that obtains operation information pertaining to the operation of the piezoelectric element during a period that is a part of a drive cycle in which the piezoelectric element is driven, and a control unit that performs feedback control of the drive parameters for driving the piezoelectric element based on the operation information.

Accordingly, the piezoelectric actuator drive method, the piezoelectric actuator drive circuit, and the piezoelectric actuator drive system according to the present embodiment provide similar effects to those of the piezoelectric actuator drive method, the piezoelectric actuator drive circuit, and the piezoelectric actuator drive system according to the above-described first embodiment. In addition, the piezoelectric actuator drive method, the piezoelectric actuator drive circuit, and the piezoelectric actuator drive system according to the present embodiment can control the vibration state of the piezoelectric element with a high level of accuracy by extracting a displacement change component of the movement amount of the slider to be moved, which is effective for the driving force of the piezoelectric actuator.

The present disclosure is not limited to the piezoelectric actuator drive method, the piezoelectric actuator drive circuit, and the piezoelectric actuator drive system according to the above first embodiment to fourth embodiment, and many variations are possible.

In the above first embodiment to fourth embodiment, the drive voltage for driving the piezoelectric element has a rectangular voltage waveform, but the present disclosure is not limited thereto. For example, the drive voltage may have a voltage waveform that is blunted or sinusoidal on at least one of the rising and falling edges.

In the above first embodiment to fourth embodiment, the representative value extracted from the operation information obtained discretely is, for example, the average value of the values of the digital signal containing the operation information, but the present disclosure is not limited thereto. For example, the representative value extracted from the operation information pertaining to the operation of the piezoelectric element, obtained discretely, may be a derivative of the operation information obtained discretely. The derivative corresponds to the rate of change of the drive current flowing in the piezoelectric element. The point in time at which the change in drive current becomes large (i.e., the point in time at which the drive current accelerates) may serve as the starting point of the operation information obtainment period, and the area where the change in the drive current saturates may serve as the end point of the operation information obtainment period.

In the first variation on the above first embodiment, the control unit 11 may be configured to perform feedback control of the drive parameters based on a derivative extracted from the operation information continuously obtained and stored by the drive current extraction unit 123. In other words, the control unit 11 may be configured to perform feedback control of the drive parameters based on the comparison result between the derivative and the target value of the drive information stored in advance as the value of the analog voltage.

The piezoelectric actuator drive circuit according to the above second embodiment includes the flow rate change detection unit 31 and the discharge pressure detection unit 32, but the present disclosure is not limited thereto. The piezoelectric actuator drive circuit may include either the flow rate change detection unit 31 or the discharge pressure detection unit 32.

In the above first embodiment to third embodiment, the starting point of the operation information obtainment period is delayed by the phase ß or by the time d or dr with respect to the drive voltage, but the present disclosure is not limited thereto. For example, the starting point of the operation information obtainment period may be at a point in time that is a quarter of one cycle of the drive cycle. In this case, because there is no need to obtain the phase ß, the times d and dr, or the like in advance, the manufacturing process of the piezoelectric actuator drive circuit and the piezoelectric actuator drive system can be simplified, and the cost of the piezoelectric actuator drive circuit and the piezoelectric actuator drive system can be reduced.

The above first embodiment to fourth embodiment are configured to obtain the operation information during one of a positive and negative polarity side periods of one cycle of the drive cycle, but the present disclosure is not limited thereto. For example, the operation information may be obtained during both the positive and negative polarity side periods of one cycle of the drive cycle. In this case, the drive parameters may be controlled based on a representative value (e.g., an average value, a maximum value, a derivative, or the like) extracted from the operation information obtained on the positive polarity side and the operation information obtained on the negative polarity side, respectively.

Although the present disclosure has been described with reference to embodiments, the present disclosure is not limited to the above embodiments and the like, and many variations are possible. The effects described in the present specification are merely examples. The effects of the present disclosure are not limited to the effects described in the present specification. The present disclosure may have effects other than those described in the present specification.

In addition, for example, the present disclosure can be configured as follows.

(1)

A piezoelectric actuator drive method, the method comprising:
  obtaining operation information pertaining to operation of a piezoelectric element in a period that is a part of one cycle of a drive cycle in which the piezoelectric element is driven; and
  performing feedback control of a drive parameter for driving the piezoelectric element based on the operation information.

(2)

The piezoelectric actuator drive method according to the foregoing (1),
  wherein a period from when the force generated by the piezoelectric element is maximum to a point in time of half the drive cycle is the longest period that can be set as the period that is the part.

(3)

The piezoelectric actuator drive method according to the foregoing (1) or (2),
  wherein a drive current flowing in the piezoelectric element is obtained as the operation information.

(4)

The piezoelectric actuator drive method according to the foregoing (1) or (2), wherein a vibration voltage produced by vibration or displacement of the piezoelectric element is obtained as the operation information.

(5)

The piezoelectric actuator drive method according to the foregoing (1) or (2),
wherein a drive current flowing in the piezoelectric element and a vibration voltage generated by vibration of the piezoelectric element are obtained as the operation information at the same time or alternately.

(6)

The piezoelectric actuator drive method according to any one of the foregoing (1) to (5),
wherein the drive parameter is a drive frequency for driving the piezoelectric element.

(7)

The piezoelectric actuator drive method according to any one of the foregoing (1) to (5),
wherein the drive parameter is a drive pulse width for driving the piezoelectric element.

(8)

The piezoelectric actuator drive method according to the foregoing (6),
wherein the drive parameter is a drive voltage for driving the piezoelectric element, and
feedback control of the drive parameter is performed by modulating the drive frequency of the drive voltage without changing a maximum amplitude of the drive voltage.

(9)

The piezoelectric actuator drive method according to the foregoing (7),
wherein the drive parameter is a drive voltage for driving the piezoelectric element, and
feedback control of the drive parameter is performed by modulating the drive pulse width of the drive voltage without changing a maximum amplitude of the drive voltage.

(10)

The piezoelectric actuator drive method according to any one of the foregoing (1) to (7),
wherein the drive parameter is a drive voltage for driving the piezoelectric element, and
feedback control of the drive parameter is performed by switching a maximum amplitude of the drive voltage between at least two potentials having different values.

(11)

The piezoelectric actuator drive method according to any one of the foregoing (1) to (10),
wherein the operation information is obtained and stored continuously.

(12)

The piezoelectric actuator drive method according to any one of the foregoing (1) to (10),
wherein the operation information is obtained discretely.

(13)

The piezoelectric actuator drive method according to the foregoing (12),
wherein feedback control of the drive parameter is performed based on a representative value extracted from the operation information obtained discretely.

(14)

The piezoelectric actuator drive method according to the foregoing (13),
wherein the representative value is a mean value or a derivative of the operation information obtained discretely.

(15)

The piezoelectric actuator drive method according to the foregoing (11),
wherein feedback control of the drive parameter is performed based on a derivative extracted from the operation information obtained and stored continuously.

(16)

A piezoelectric actuator drive circuit, the drive circuit comprising:
an obtainment unit that obtains operation information pertaining to operation of a piezoelectric element in a period that is a part of one cycle of a drive cycle in which the piezoelectric element is driven; and
a control unit that performs feedback control of a drive parameter for driving the piezoelectric element based on the operation information.

(17)

A piezoelectric actuator drive system, the drive system comprising:
a piezoelectric element; and
a piezoelectric actuator drive circuit including an obtainment unit that obtains operation information pertaining to operation of the piezoelectric element in a period that is a part of one cycle of a drive cycle in which the piezoelectric element is driven, and a control unit that performs feedback control of a drive parameter for driving the piezoelectric element based on the operation information.

It is to be understood that those skilled in the art may conceive of various modifications, combinations, sub-combinations, and changes, depending on design requirements and other factors, which are included within the scope of the appended claims and their equivalents.

REFERENCE SIGNS LIST

1 Piezoelectric actuator drive system
10 Piezoelectric actuator drive circuit
11 Control unit
12 Operation information obtainment unit
13 H-bridge circuit
14, 15, 124b Resistance element
20, 40, 42 Piezoelectric actuator
21, 41, 43 Piezoelectric element
30, 60 Piezoelectric pump
31 Flow rate change detection unit
32 Discharge pressure detection unit
33 Cover part
51 Reflected light amount detection unit
71 Movement amount detection unit
72 Differentiation circuit
80 Positioning mechanism
121 Differential amplifying unit
122 Analog-to-digital converter unit
123 Drive current extraction unit
124 Integrating circuit
124a Amplifier
124c Capacitor
125 Switch element
131, 132, 133, 134 Transistor
135 DC power supply
211 Piezoelectric body
212 First electrode
213 Second electrode
214, 215, 217, 218 Wire
216 Electrode terminal
411 Exhaust port 412 Valve
413 Inlet
414 Main body part
415 Light entry/exit part
511, 711 Light source
512, 712 Light receiving unit
811 Slider
812 Stator

The invention claimed is:

1. A piezoelectric actuator drive method, the method comprising:
    obtaining operation information pertaining to operation of a piezoelectric element in a period that is a part of one cycle of a drive cycle in which the piezoelectric element is driven; and
    performing feedback control of a drive parameter for driving the piezoelectric element based on the operation information, wherein
    a period from when the force generated by the piezoelectric element is maximum to a point in time of half the drive cycle is the longest period that can be set as the period that is the part.

2. The piezoelectric actuator drive method according to claim 1, wherein a drive current flowing in the piezoelectric element is obtained as the operation information.

3. The piezoelectric actuator drive method according to claim 1, wherein a vibration voltage produced by vibration or displacement of the piezoelectric element is obtained as the operation information.

4. The piezoelectric actuator drive method according to claim 1, wherein a drive current flowing in the piezoelectric element and a vibration voltage generated by vibration of the piezoelectric element are obtained as the operation information at the same time or alternately.

5. The piezoelectric actuator drive method according to claim 1, wherein the drive parameter is a drive frequency for driving the piezoelectric element.

6. The piezoelectric actuator drive method according to claim 5, wherein the drive parameter is a drive voltage for driving the piezoelectric element, and feedback control of the drive parameter is performed by modulating the drive frequency of the drive voltage without changing a maximum amplitude of the drive voltage.

7. The piezoelectric actuator drive method according to claim 1, wherein the drive parameter is a drive pulse width for driving the piezoelectric element.

8. The piezoelectric actuator drive method according to claim 7, wherein the drive parameter is a drive voltage for driving the piezoelectric element, and feedback control of the drive parameter is performed by modulating the drive pulse width of the drive voltage without changing a maximum amplitude of the drive voltage.

9. The piezoelectric actuator drive method according to claim 1, wherein the drive parameter is a drive voltage for driving the piezoelectric element, and feedback control of the drive parameter is performed by switching a maximum amplitude of the drive voltage between at least two potentials having different values.

10. The piezoelectric actuator drive method according to claim 1, wherein the operation information is obtained and stored continuously.

11. The piezoelectric actuator drive method according to claim 10, wherein feedback control of the drive parameter is performed based on a derivative extracted from the operation information obtained and stored continuously.

12. The piezoelectric actuator drive method according to claim 1, wherein the operation information is obtained discretely.

13. The piezoelectric actuator drive method according to claim 12, wherein feedback control of the drive parameter is performed based on a representative value extracted from the operation information obtained discretely.

14. The piezoelectric actuator drive method according to claim 13, wherein the representative value is a mean value or a derivative of the operation information obtained discretely.

15. A piezoelectric actuator drive circuit, the drive circuit comprising:
    an obtainment unit that obtains operation information pertaining to operation of a piezoelectric element in a period that is a part of one cycle of a drive cycle in which the piezoelectric element is driven; and
    a control unit that performs feedback control of a drive parameter for driving the piezoelectric element based on the operation information, wherein
    a period from when the force generated by the piezoelectric element is maximum to a point in time of half the drive cycle is the longest period that can be set as the period that is the part.

16. A piezoelectric actuator drive system, the drive system comprising:
    a piezoelectric element; and
    a piezoelectric actuator drive circuit including an obtainment unit that obtains operation information pertaining to operation of the piezoelectric element in a period that is a part of one cycle of a drive cycle in which the piezoelectric element is driven, and a control unit that performs feedback control of a drive parameter for driving the piezoelectric element based on the operation information, wherein
    a period from when the force generated by the piezoelectric element is maximum to a point in time of half the drive cycle is the longest period that can be set as the period that is the part.

* * * * *